(12) United States Patent
Fujii et al.

(10) Patent No.: US 9,941,397 B2
(45) Date of Patent: Apr. 10, 2018

(54) SEMICONDUCTOR DEVICE AND METHOD OF MANUFACTURING SEMICONDUCTOR DEVICE

(71) Applicant: FUJI ELECTRIC CO., LTD., Kawasaki-shi, Kanagawa (JP)

(72) Inventors: Takeshi Fujii, Matsumoto (JP); Seiji Momota, Matsumoto (JP)

(73) Assignee: FUJI ELECTRIC CO., LTD., Kawasaki-Shi, Kanagawa (JP)

( * ) Notice: Subject to any disclaimer, the term of this patent is extended or adjusted under 35 U.S.C. 154(b) by 0 days.

(21) Appl. No.: 15/250,972

(22) Filed: Aug. 30, 2016

(65) Prior Publication Data

US 2016/0372586 A1 Dec. 22, 2016

Related U.S. Application Data

(63) Continuation of application No. PCT/JP2015/072919, filed on Aug. 13, 2015.

(30) Foreign Application Priority Data

Sep. 17, 2014 (JP) ................. 2014-188682

(51) Int. Cl.
*H01L 29/739* (2006.01)
*H01L 29/423* (2006.01)
(Continued)

(52) U.S. Cl.
CPC ...... *H01L 29/7397* (2013.01); *H01L 29/0619* (2013.01); *H01L 29/0696* (2013.01);
(Continued)

(58) Field of Classification Search
CPC ........... H01L 29/7397; H01L 29/42368; H01L 29/42376; H01L 29/0619; H01L 29/0696;
(Continued)

(56) References Cited

U.S. PATENT DOCUMENTS 5,381,026 A * 1/1995 Shinohe ............ H01L 29/42308
257/147
5,937,296 A * 8/1999 Arnold .............. H01L 27/10841
257/E27.096
(Continued)

FOREIGN PATENT DOCUMENTS

JP 2005-150246 A 6/2005
JP 2006-324488 A 11/2006
(Continued)

OTHER PUBLICATIONS

Masakiyo Sumitomo et al., "Low loss IGBT with Partially Narrow Mesa Structure (PNM-IGBT)", Proceedings of the 2012 24th International Symposium on Power Semiconductor Devices and ICs (ISPSD), pp. 17-20, Jun. 3-7, 2012.

*Primary Examiner* — Jarrett Stark
(74) *Attorney, Agent, or Firm* — Rabin & Berdo, P.C.

(57) ABSTRACT

In a trench deeper than a thickness of a p-type base layer and configured by a first trench and a second trench, a second trench positioned at a lower portion is configured by a third trench and a fourth trench. A width of the second trench along an X direction is expanded more than the first trench positioned above the second trench. Along the X direction, the extent to which the second trench is expanded differs for the third trench and the fourth trench. Thus, a width of the lower portion of the trench differs along a Y direction, enabling reduced gate capacitance compared to uniform expansion along a transverse direction of the trench. Further, ON voltage may be reduced and switching capability may be improved.

11 Claims, 32 Drawing Sheets

(51) Int. Cl.
*H01L 29/78* (2006.01)
*H01L 29/66* (2006.01)
*H01L 29/06* (2006.01)

(52) U.S. Cl.
CPC ...... *H01L 29/423* (2013.01); *H01L 29/42368* (2013.01); *H01L 29/42376* (2013.01); *H01L 29/66348* (2013.01); *H01L 29/78* (2013.01)

(58) Field of Classification Search
CPC .. H01L 29/66348; H01L 29/423; H01L 29/78
See application file for complete search history.

(56) References Cited

U.S. PATENT DOCUMENTS

| | | | |
|---|---|---|---|
| 6,075,269 A * | 6/2000 | Terasawa | H01L 21/30604 257/153 |
| 6,521,538 B2 * | 2/2003 | Soga | H01L 21/76232 257/E21.384 |
| 7,791,134 B2 * | 9/2010 | Ooki | H01L 29/4236 257/330 |
| 9,536,999 B2 * | 1/2017 | Laven | H01L 29/4236 |
| 2006/0267085 A1 | 11/2006 | Matsuura | |
| 2007/0040213 A1 | 2/2007 | Hotta et al. | |
| 2008/0054351 A1 | 3/2008 | Ooki | |
| 2010/0230747 A1 * | 9/2010 | Barletta | H01L 29/42368 257/334 |
| 2012/0056241 A1 | 3/2012 | Sumitomo et al. | |
| 2014/0217464 A1 | 8/2014 | Higuchi et al. | |
| 2015/0115314 A1 | 4/2015 | Arakawa et al. | |
| 2015/0279953 A1 * | 10/2015 | Machida | H01L 29/456 257/330 |
| 2016/0064476 A1 * | 3/2016 | Kobayashi | H01L 29/7397 257/139 |
| 2016/0197143 A1 * | 7/2016 | Naito | H01L 29/66348 257/334 |
| 2016/0329323 A1 * | 11/2016 | Iwasaki | H01L 29/32 |

FOREIGN PATENT DOCUMENTS

| | | |
|---|---|---|
| JP | 2008-060138 A | 3/2008 |
| JP | 2012-080074 A | 4/2012 |
| JP | 2013-084922 A | 5/2013 |
| JP | 2013-214696 A | 10/2013 |

* cited by examiner

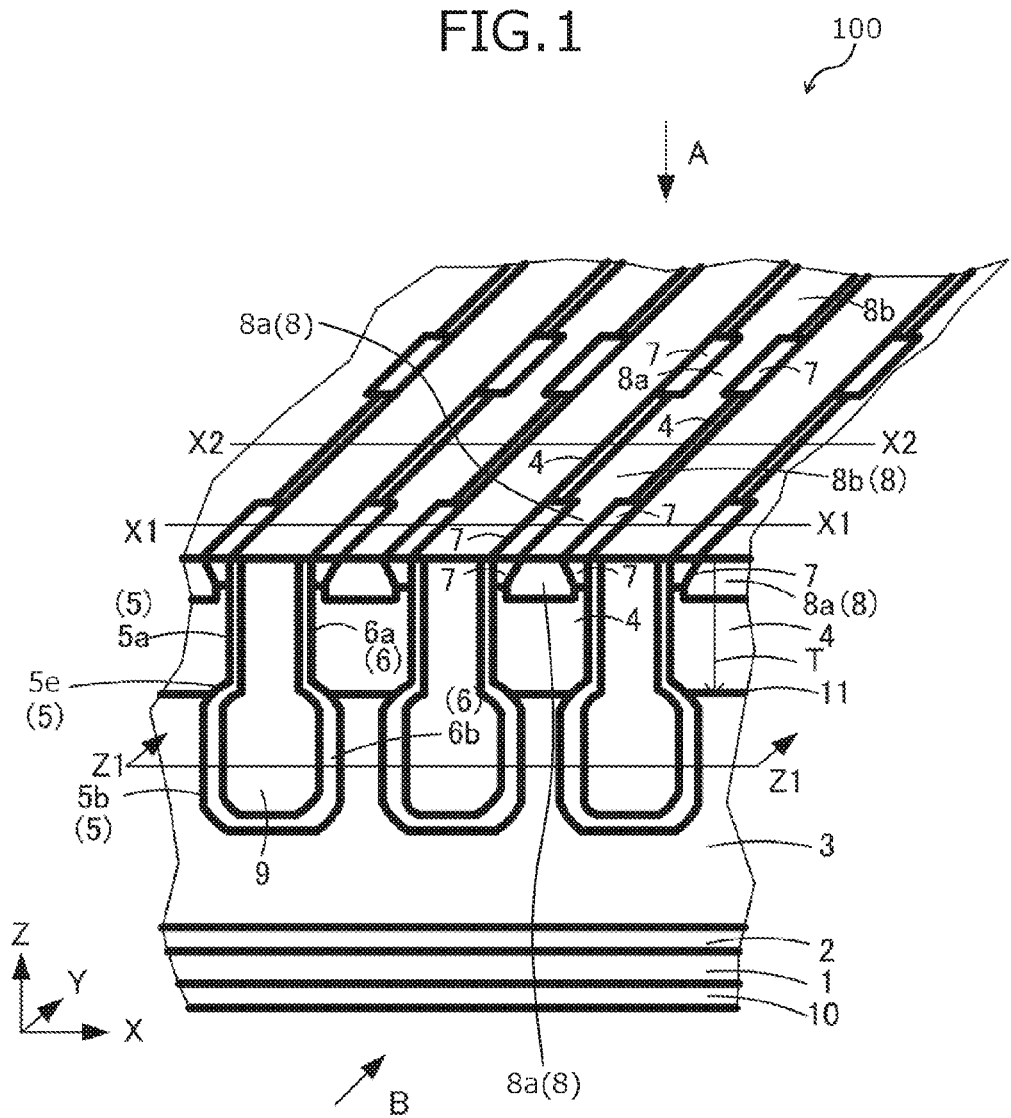

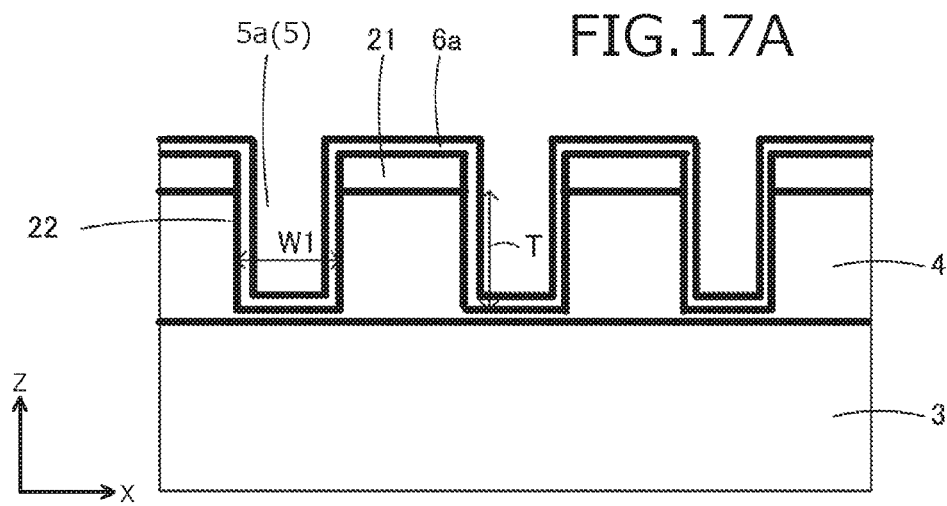
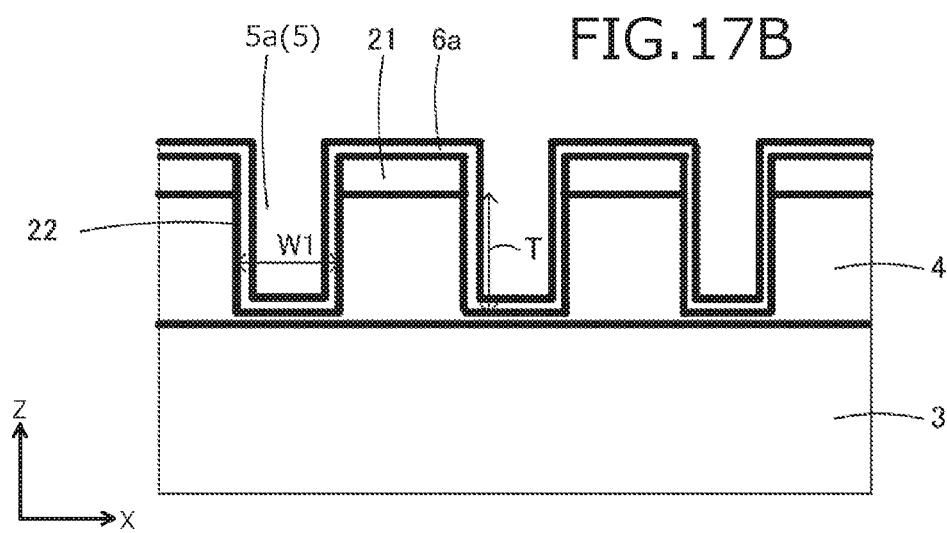
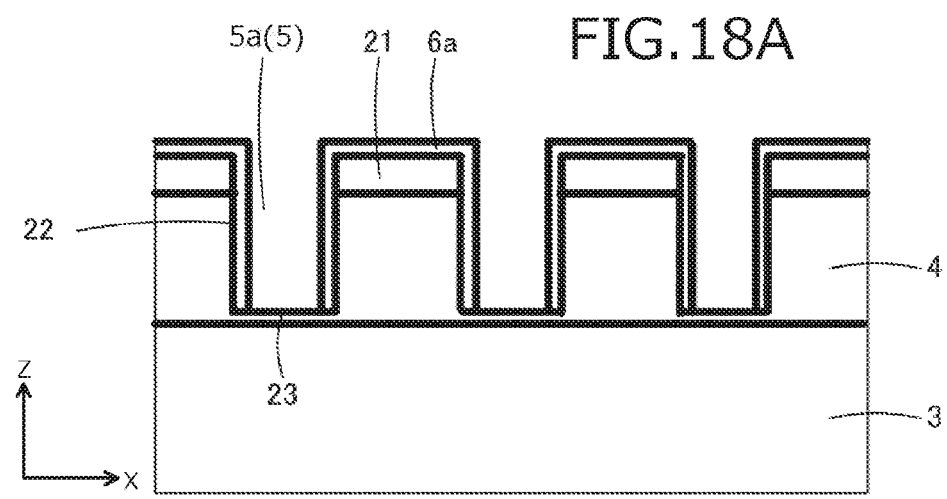

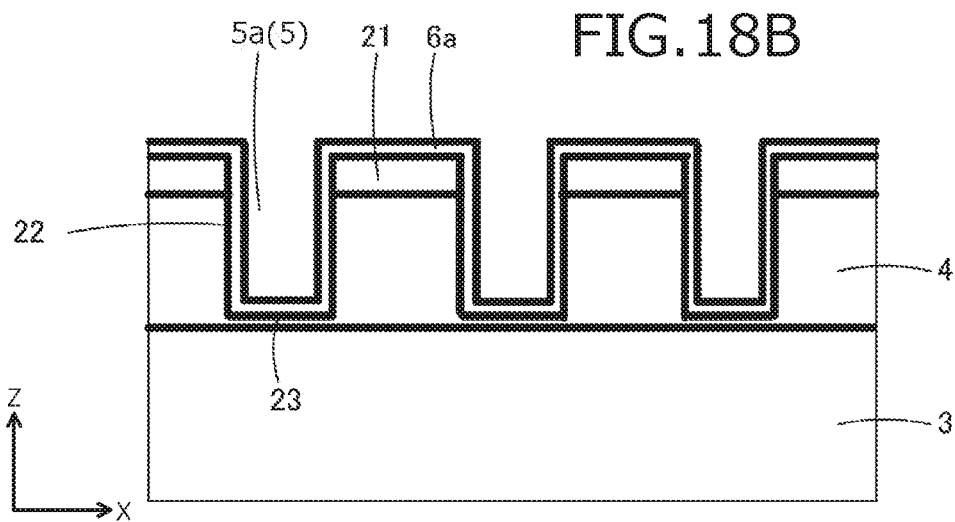
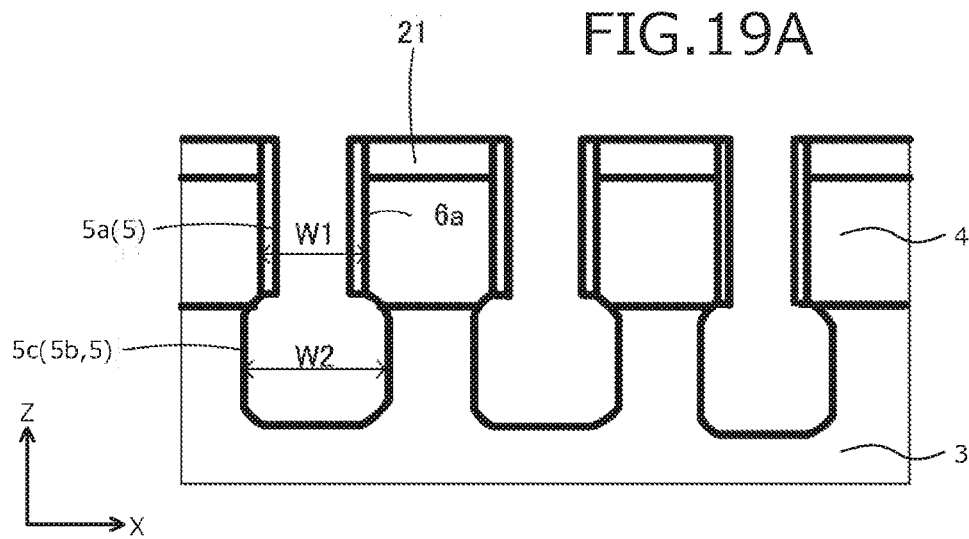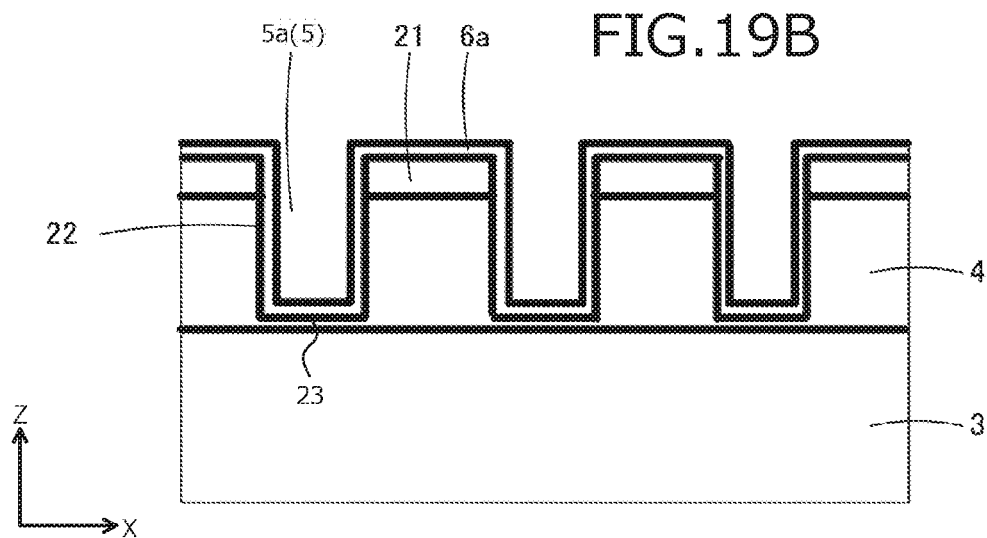

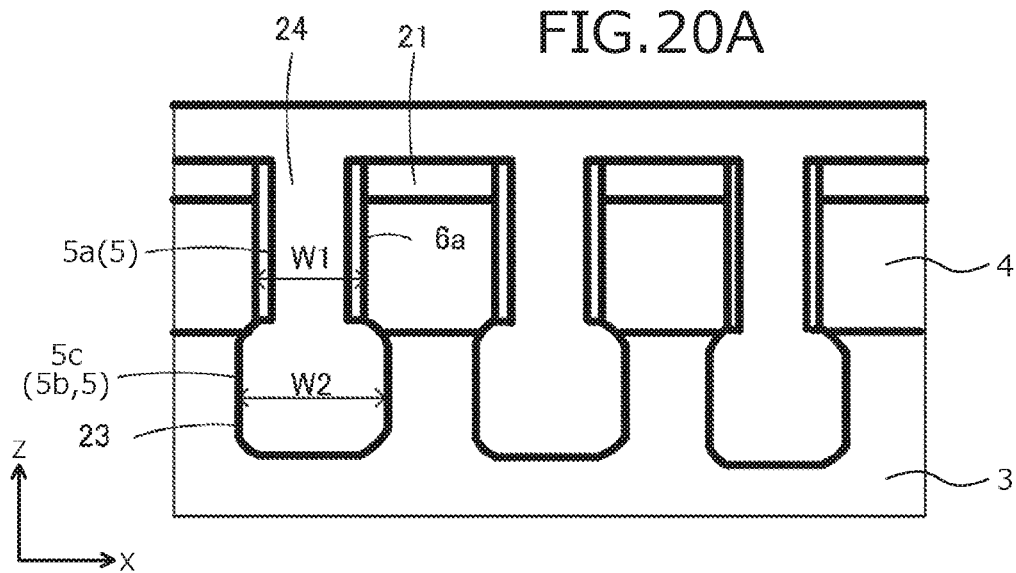
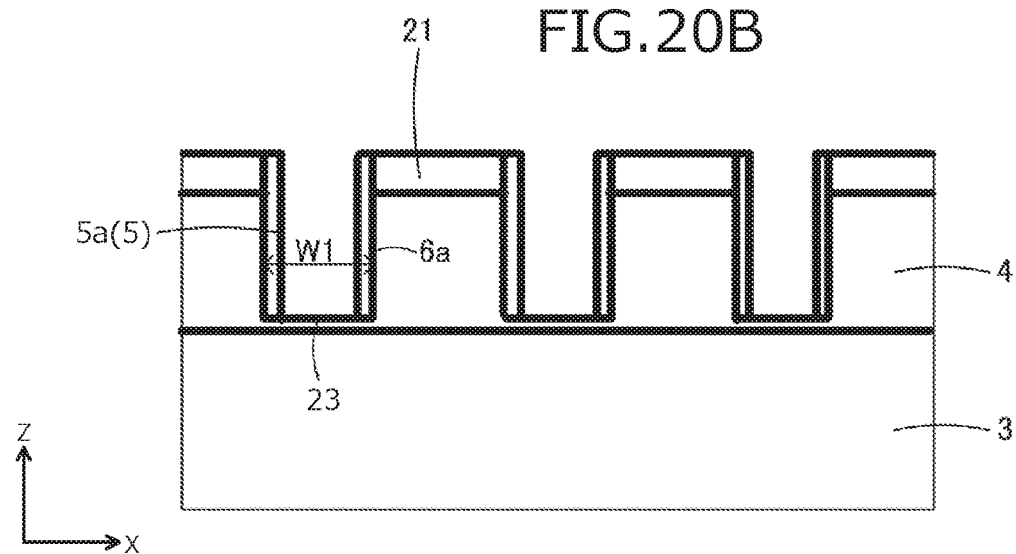

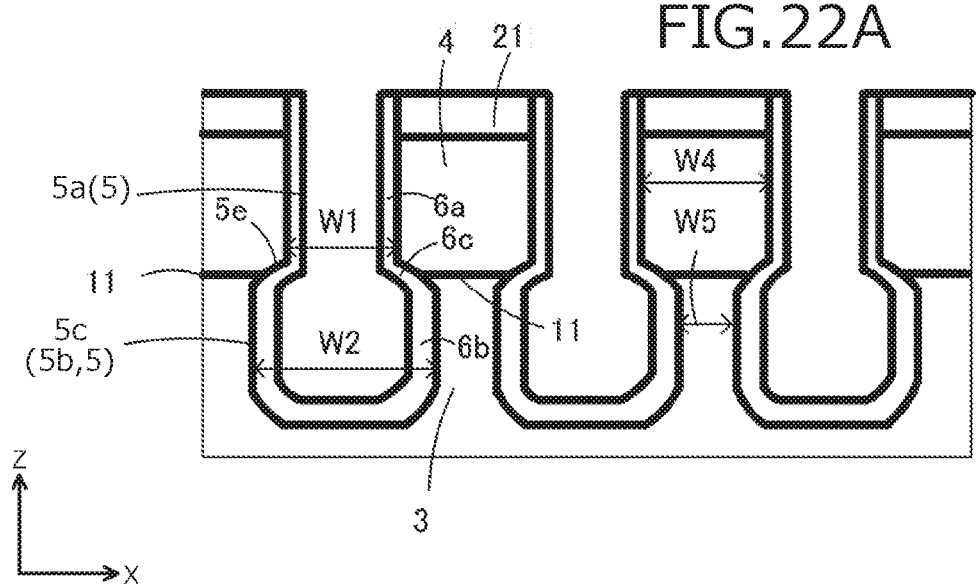
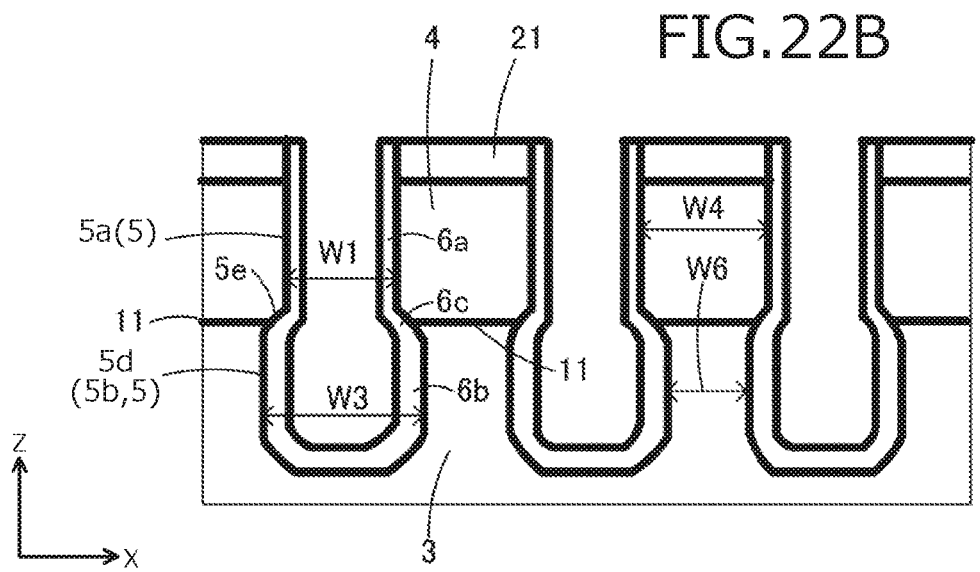

SEMICONDUCTOR DEVICE AND METHOD OF MANUFACTURING SEMICONDUCTOR DEVICE

CROSS REFERENCE TO RELATED APPLICATIONS

This is a continuation application of International Application PCT/JP2015/072919 filed on Aug. 13, 2015, which claims priority from Japanese Patent Application No. 2014-188682 filed on Sep. 17, 2014, the contents of which are incorporated herein by reference.

BACKGROUND OF THE INVENTION

1. Field of the Invention

The embodiments discussed herein relate to a semiconductor device such as an insulated gate bipolar transistor (IGBT) of a trench gate structure.

2. Description of the Related Art

In the power electronics field, it is desirable for IGBTs used as switching devices to have low switching loss (turn OFF loss, turn ON loss), which is transient loss, and low saturation voltage (ON voltage) related to steady-state loss, in addition to high switching capability (resistance to latch up). Therefore, improvements to achieve such characteristics are advancing.

Mainstream IGBTs frequently use a striped trench gate structure. A structure that reduces the ON voltage by an intentional expansion of a lower portion (bottom portion) of the striped trench gate structure has been proposed (for example, refer to Japanese Patent Application Laid-Open Publication No. 2013-84922). FIG. 37 is a cross-sectional view of a main portion of a conventional IGBT 800 in which the lower portion of the trench gate structure has been expanded. In FIG. 37, reference sign 51 represents a p-type collector layer; reference sign 52 represents an n-type buffer layer; reference sign 53 represents an n-type drift layer; reference sign 54 represents a p-type base layer; reference sign 55 represents a trench; reference sign 56 represents a gate insulating film; reference sign 57 represents an n-type emitter layer; reference sign 58 represents a p-type contact layer; reference sign 59 represents a gate electrode; and reference sign 60 represents a collector electrode.

When across the entire region of the n-type drift layer 53, the lower portion of each trench 55 is expanded, lower portions of the n-type drift layer 53 between adjacent the trenches 55 form narrow stripes. The technique described in Japanese Patent Application Laid-Open Publication No. 2013-84922 adopts this structure and thereby, suppresses the amount of holes drawn from the p-type contact layer 58 through the p-type base layer 54 disposed on the n-type drift layer 53 and causes holes to accumulate in the n-type drift layer 53, which is an upper portion connected to the channel. Consequently, the amount of electrons attracted by the accumulated holes and injected into the n-type drift layer 53 through the channel increase, whereby the ON voltage decreases. Increasing the amount of electrons injected from the channel by an accumulation of holes in this manner is called the injection enhancement (IE) effect.

Another conventional technology includes L-shaped trench gates formed in a vertical direction with respect to a first principal surface of the $n^-$-type layer, from a surface of a p-type base layer to a position inside an $n^-$-type layer (drift layer). The L-shaped trench gates have a bottom extended on one side for a predetermined length, in a horizontal direction with respect to the first principal surface of the $n^-$-type layer. Predetermined adjacent L-shaped trench gates are disposed with the bottoms expanding in opposing directions to face each other and are spaced at an interval that is less than an interval between portions formed in vertical direction with respect to the first principal surface of the $n^-$-type layer, thereby enabling reduction of the ON voltage and loss (for example, refer to Japanese Patent Application Laid-Open Publication No. 2008-60138).

According to another conventional technique, a semiconductor device has an $n^+$-type emitter region connected to an emitter electrode, a $p^-$-type body region surrounding the emitter region and connected to the emitter electrode, an $n^-$-type drift region contacting the body region and isolated from the emitter region by the body region, and a trench gate electrode opposing, via a gate insulating film, the body region isolating the drift region from the emitter region. In the semiconductor, a portion of the trench gate electrode in a longitudinal direction of the trench gate electrode is formed to have a different trench width, whereby the minority carrier concentration in the body region is decreased (for example, refer to Japanese Patent Application Laid-Open Publication No. 2005-150246).

SUMMARY OF THE INVENTION

According to one aspect of the present invention, in a semiconductor device including a first semiconductor layer of a first conductivity type; a second semiconductor layer of a second conductivity type, disposed on a first principal surface of the first semiconductor layer; a trench of a striped-shape and penetrating the second semiconductor layer from a surface of the second semiconductor layer and reaching inside first semiconductor layer, the trench being provided in plural; a gate insulating film disposed on an inner wall of the trench; a third semiconductor layer of the first conductivity type, contacting a side wall of the trench and disposed selectively on a surface layer of the second semiconductor layer along a transverse direction of the trench; a fourth semiconductor layer of the second conductivity type, contacting the third semiconductor layer and disposed on the surface layer of the second semiconductor layer; a main electrode electrically connected to the second semiconductor layer and the third semiconductor layer; and a gate electrode disposed inside the trench via the gate insulating film, the trench includes a first trench portion disposed in the second semiconductor layer on a first principal surface side of the trench; a second trench portion farther on a first semiconductor layer side of the trench than the first trench portion, connected to the first trench portion, and having a bottom disposed inside the first semiconductor layer. Further, the second trench portion includes a third trench portion positioned along a side wall of the second trench portion, below the third semiconductor layer; and a fourth trench portion positioned along the side wall of second trench portion, below the second semiconductor layer flanked by the third semiconductor layer along a length direction of the trench. The gate insulating film includes a first gate insulating film portion disposed on a side wall of the first trench portion along the side wall of the trench; and a second gate insulating film portion disposed on the side wall of the second trench portion along the side wall of the trench. A width of the second trench portion is wider than a width of the first trench portion, and a width of the third trench portion and a width of the fourth trench portion respectively differ.

In the semiconductor device, a film thickness of the second gate insulating film portion is wider than a film thickness of the first gate insulating film portion.

In the semiconductor device, a pn junction of the first semiconductor layer and the second semiconductor layer is positioned in a transition region where a width of the trench increases from the first trench portion toward the second trench portion.

In the semiconductor device, a pn junction of the first semiconductor layer and the second semiconductor layer is positioned at the side wall of the first trench portion.

In the semiconductor device, a film thickness of the second gate insulating film portion is equivalent to a film thickness of the first gate insulating film portion, a pn junction of the first semiconductor layer and the second semiconductor layer is positioned at the second trench portion.

The semiconductor device further includes a fifth semiconductor layer of the second conductivity type, where the fourth semiconductor layer penetrates the third semiconductor layer; and a sixth semiconductor layer of the second conductivity type, connected to the fifth semiconductor layer, dividing the third semiconductor layer, and disposed on the second semiconductor layer.

In the semiconductor device, the third semiconductor layer is divided by the fourth semiconductor layer along a longitudinal direction, and the third semiconductor layer and the fourth semiconductor layer are alternately disposed along the longitudinal direction.

In the semiconductor device, the third semiconductor layer contacting a first side wall of the trench is alternately disposed with a second third semiconductor layer contacting a second side wall of the trench.

In the semiconductor device, the trench disposed in plural includes trenches where the third semiconductor layer is not disposed and the second semiconductor layer is not connected to the main electrode and in a floating state.

According to another aspect, a method of manufacturing a semiconductor device including a first semiconductor layer of a first conductivity type; a second semiconductor layer of a second conductivity type, disposed on a first principal surface of the first semiconductor layer; a trench of a striped-shape and penetrating the second semiconductor layer from a surface of the second semiconductor layer and reaching inside first semiconductor layer, the trench being provided in plural; a gate insulating film disposed on an inner wall of the trench; a third semiconductor layer of the first conductivity type, contacting a side wall of the trench and disposed selectively on a surface layer of the second semiconductor layer along a transverse direction of the trench; a fourth semiconductor layer of the second conductivity type, contacting the third semiconductor layer and disposed on the surface layer of the second semiconductor layer; a main electrode electrically connected to the second semiconductor layer and the third semiconductor layer; and a gate electrode disposed inside the trench via the gate insulating film, includes forming an etching mask used to perform anisotropic etching to form of the trench of a striped shape in plural; forming a first gate insulating film on a side wall of a first trench; performing isotropic etching to form a second trench having a vessel-like shape of a width wider than the first trench in a depth direction from a bottom of the first trench; forming a second gate insulating film on an inner wall of the second trench to be thicker than the first gate insulating film; and forming the second trench by a third trench and a fourth trench of differing widths.

In the method, plural second semiconductor layers of the second conductivity type, flanked by the first trench are divided into a group forming the third semiconductor layer of the first conductivity type, connected to the main electrode and a group becoming a floating portion not connected to the main electrode, both trench side walls contacting the floating portion are flattened by anisotropic etching.

In the method, a first gate oxide film is formed by one of an oxide film and a nitride film deposited by a chemical vapor deposition (CVD) method.

In the method, the second gate insulating film is formed by a thermal oxide film.

Objects, features, and advantages of the present invention are specifically set forth in or will become apparent from the following detailed description of the invention when read in conjunction with the accompanying drawings.

BRIEF DESCRIPTION OF THE DRAWINGS

FIG. 1 is a perspective view of a main portion of a semiconductor device 100 according to a first embodiment;

FIGS. 14A, 14B, 15A, 15B, 16A, 16B, 17A, 17B, 18A, 18B, 19A, 19B, 20A, 20B, 21A, 21B, 22A, 22B, 23A, and 23B are diagrams of a method of manufacturing the semiconductor device 100 according to a seventh embodiment;

DETAILED DESCRIPTION OF THE INVENTION

Embodiments of a semiconductor device and a method of manufacturing the semiconductor device according to the present invention will be described in detail with reference to the accompanying drawings. In the embodiments, description will be given assuming a first conductivity type to be an n-type and a second conductivity type to be a p-type. Nonetheless, without limiting the first conductivity type to the n-type and the second conductivity type to the p-type, the first conductivity type may be the p-type and the second conductivity type may be the n-type.

Figure 2A:
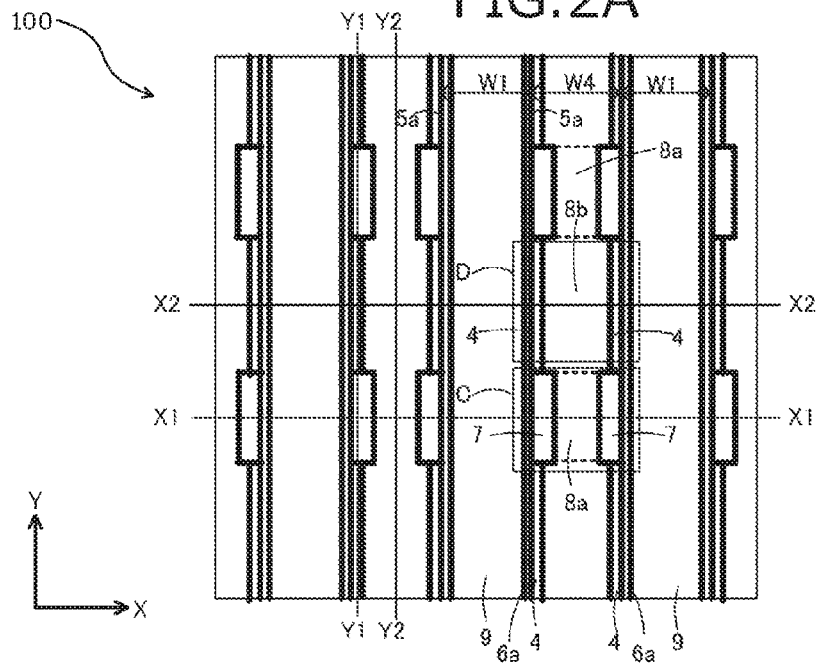
FIGS. 2A and 2B are plan views of the semiconductor device 100 according to the first embodiment.
Figure 2B:
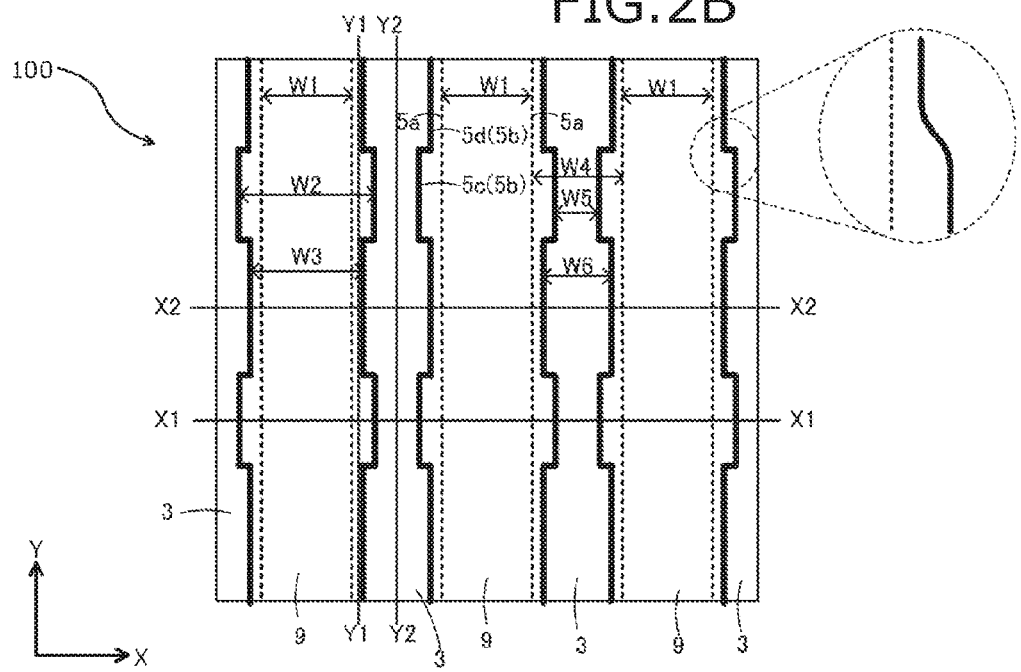

Configuration of a semiconductor device 100 according to a first embodiment of the present invention will be described. FIG. 1 is a perspective view of a main portion of the semiconductor device 100 according to the first embodiment. FIGS. 2A and 2B are plan views of the semiconductor device 100 according to the first embodiment. In FIGS. 2A and 2B, the semiconductor device 100 is depicted as viewed from a direction indicated by arrow A in FIG. 1. FIG. 2A depicts a layout of a main portion of the semiconductor device 100. FIG. 2B depicts, as viewed from the direction indicated by arrow A, a cross-section of a main portion of the semiconductor device 100 cut in a horizontal direction along cutting line Z1-Z1 depicted in FIG. 1.

Figure 3A:
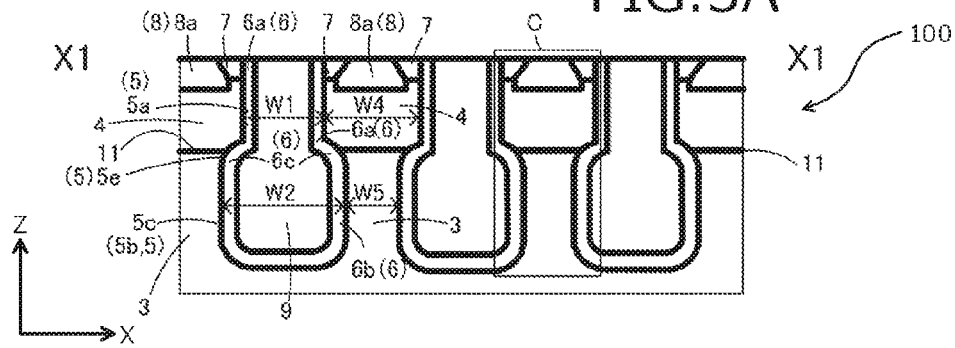
FIGS. 3A, 3B, 3C, and 3D are cross-sectional views of a main portion of the semiconductor device 100 according to the first embodiment.
Figure 3B:
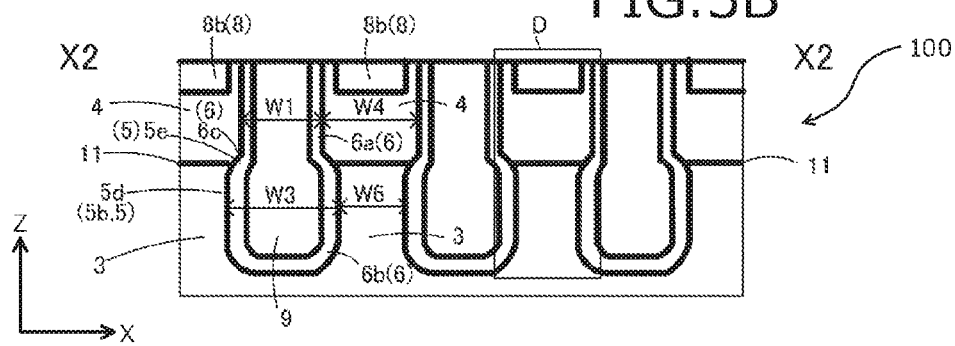
Figure 3C:
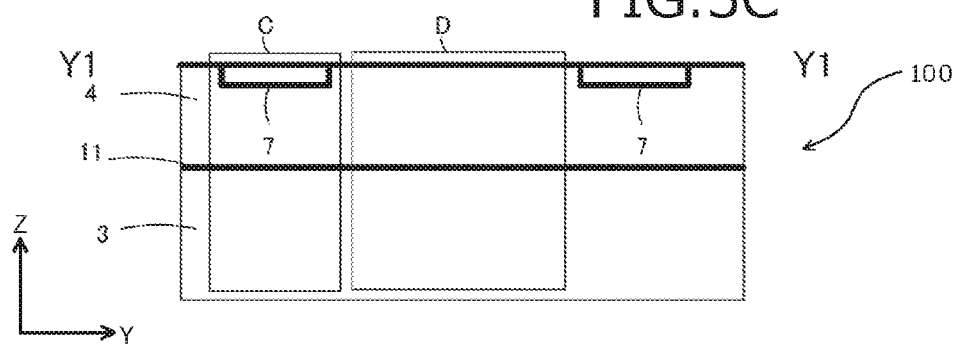
Figure 3D:
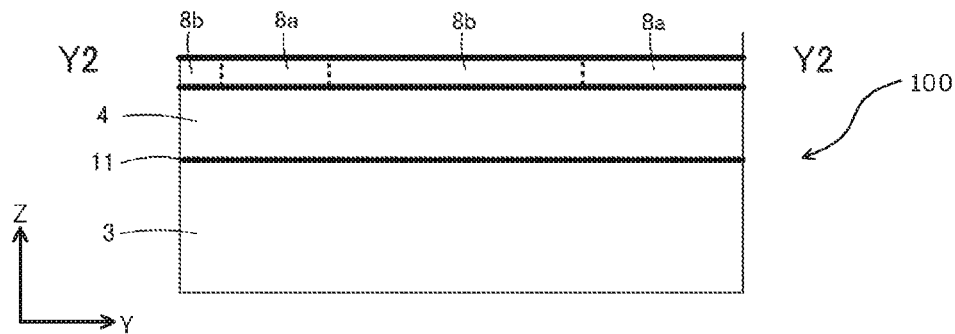

FIGS. 3A, 3B, 3C, and 3D are cross-sectional views of a main portion of the semiconductor device 100 according to the first embodiment. FIGS. 3A to 3D depict a cross-section of a main portion of the semiconductor device 100 as viewed from a direction indicated by arrow B in FIG. 1. FIG. 3A depicts a cross-section of the semiconductor device 100 cut along cutting line X1-X1 depicted in FIGS. 2A and 2B. FIG. 3B depicts a cross-section of the semiconductor device 100 cut along cutting line X2-X2 depicted in FIG. 2A and 2B. FIG. 3C depicts a cross-section of a main portion of the semiconductor device 100 cut along cutting line Y1-Y1 depicted in FIGS. 2A and 2B. FIG. 3D depicts a cross-section of a main portion of the semiconductor device 100 cut along cutting line Y2-Y2 depicted in FIGS. 2A and 2B.

In FIGS. 1, 2A, 2B, and 3A to 3D, the semiconductor device 100 according to the first embodiment includes a p-type collector layer 1, an n-type buffer layer 2 disposed on the p-type collector layer 1, an n-type drift layer 3 disposed on the n-type buffer layer 2 (also called a field stop layer), and a p-type base layer 4 disposed on the n-type drift layer 3. In the semiconductor device 100 of the first embodiment, a first semiconductor layer according to the present disclosure is implemented by the n-type drift layer 3, and a second semiconductor layer according to the present disclosure is implemented by the p-type base layer 4.

The semiconductor device 100 further includes a trench 5. The trench 5 is a groove formed in a semiconductor layer (the n-type drift layer 3 and the p-type base layer 4), penetrates the p-type base layer 4 to reach the n-type drift layer 3, and is disposed in plural in stripes (striations). The trenches 5 have a longitudinal aspect forming a striped-shape along a longitudinal direction (Y direction), and are arranged adjacently along an X direction.

An inner wall of the trench 5 is covered by the gate insulating film 6. In the first embodiment, hereinafter, when the gate insulating film 6 is formed on a side wall of the trench 5, an interface of the semiconductor layer (the n-type drift layer 3, the p-type base layer 4) and the gate insulating film 6 will be referred to as "side wall of the trench 5". In the trenches 5, an interval between facing side walls will be referred to as "width of the trench 5".

The semiconductor device 100 further has an n-type emitter layer 7 and a p-type contact layer 8. In the semiconductor device 100 of the first embodiment, a third semiconductor layer according to the present disclosure is implemented by the n-type emitter layer 7, and a fourth semiconductor layer according to the present disclosure is implemented by the p-type contact layer 8. The n-type emitter layers 7 are provided on a surface layer of the p-type base layer 4 and contact the side walls of the trenches 5. The n-type emitter layers 7 are disposed along the X direction and face each other.

The n-type emitter layer 7 is provided in plural along the Y direction and are disposed away from each other along the Y direction. In FIGS. 2A, 3A, and 3C, reference sign C indicates an area (n-type emitter portion) where the n-type emitter layer 7 is formed. Further in FIGS. 2A, 3B, and 3C, reference sign D represents an area (contact portion) where along the Y direction, the n-type emitter layer 7 is segmented and the n-type emitter layer 7 is not formed.

The p-type contact layer 8 separates the n-type emitter layers 7 and reaches the p-type base layer 4. The p-type contact layer 8 is configured by a first p-type contact layer 8a and a second p-type contact layer 8b. The first p-type contact layer 8a is a portion of the p-type contact layer 8, between the n-type emitter layers 7 along the X direction. The second p-type contact layer 8b is a portion of the p-type contact layer 8, disposed between the n-type emitter layers 7 that are disposed away from each other along the Y direction.

Thus, the n-type emitter layers 7 exposed at the surface and the second p-type contact layers 8b are alternately disposed along the Y direction. The first p-type contact layer 8a and the second p-type contact layer 8b are connected (refer to FIG. 3D). When the semiconductor device 100 is manufactured, the first p-type contact layer 8a and the second p-type contact layer 8b are formed concurrently. The n-type emitter layers 7 are disposed along the X direction so as to face each other across the first p-type contact layer 8a and are disposed along the Y direction so as to face each other across the second p-type contact layer 8b.

The semiconductor device 100 further has a gate electrode 9. The gate electrode 9 fills the trench 5, more particularly, a space bordered by a side of the gate insulating film 6 covering the inner wall of the trench 5. The semiconductor device 100 further has an emitter electrode (not depicted), a collector electrode 10 connected to the p-type collector layer 1, and an interlayer insulating film (not depicted) covering a top of the gate electrode 9. The emitter electrode is connected to the n-type emitter layer 7 and the p-type contact layer 8 through a contact hole (not depicted) disposed in the interlayer insulating film. In the semiconductor device 100 of the first embodiment, a main electrode according to the present disclosure is implemented by the emitter electrode.

As depicted in FIGS. 3A and 3B, the trench 5 is configured by two steps, a first trench 5a and a second trench 5b, along a depth direction (Z direction) from the surface of the semiconductor device 100. The second trench 5b has a cross-sectional shape where the bottom is expanded into a vessel-like shape. A width of the second trench 5b is greater than a width W1 of the first trench 5a.

The second trench 5b is configured by a third trench 5c and a fourth trench 5d. The third trench 5c is disposed on a n-type drift layer 3 side of a vicinity of a junction portion 11 of the n-type drift layer 3 disposed at a bottom side of the p-type base layer 4 and the p-type base layer 4 positioned at a bottom side (a position overlapping the n-type emitter layer 7 along the Z direction) of the n-type emitter layer 7 along the Z direction.

The third trench 5c and the fourth trench 5d are connected. A width W3 of the fourth trench 5d is less than a width W2 of the third trench 5c. A shape of a trench transition portion 5e from the first trench 5a to the third trench 5c, and from the first trench 5a to the fourth trench 5d is curved. The width W2 of the third trench 5c and the width W3 of the fourth trench 5d are each greater than the width W1 of the first trench 5a.

The gate insulating film 6 is configured by a first gate insulating film 6a and a second gate insulating film 6b. The first gate insulating film 6a is disposed on the inner wall of the first trench 5a. The second gate insulating film 6b is disposed on the respective inner walls of the third trench 5c and the fourth trench 5d configuring the second trench 5b. A thickness of the second gate insulating film 6b is greater than a thickness of the first gate insulating film 6a, whereby dielectric breakdown consequent to electric field concentration at the third trench 5c and the fourth trench 5d may be prevented.

A third gate insulating film 6c connected to the first gate insulating film 6a and the second gate insulating film 6b is disposed on the inner wall of the trench transition portion 5e. A thickness of the third gate insulating film 6c is not constant. The thickness of the third gate insulating film 6c on the side connected to the first gate insulating film 6a is a thickness of the first gate insulating film 6a, while the thickness of the third gate insulating film 6c on the side connected to the second gate insulating film 6b is a thickness of the second gate insulating film 6b. The thickness of the third gate insulating film 6c changes from the thickness of the first gate insulating film 6a to the thickness of the second gate insulating film 6b, increasing from the side near the first gate insulating film 6a side to the side near the second gate insulating film 6b.

The junction portion 11 of the p-type base layer 4 and the n-type drift layer 3 is positioned contacting the third gate insulating film 6c. The position of the junction portion 11 is determined by the relationship of the gate threshold voltage and a thickness of an accumulation layer formed at the n-type drift layer 3 near the junction portion 11. Positioning the junction portion 11 on a side near the second gate insulating film 6b results in the gate insulating film 6 becoming thick, whereby the gate threshold voltage becomes high and the accumulation layer becomes narrow. Positioning the junction portion 11 on a side near the first gate insulating film 6a results in the gate insulating film 6 becoming thin, whereby the gate threshold voltage becomes low and the accumulation layer becomes thick.

In the semiconductor device 100, in expanding the third trench 5c and the fourth trench 5d into a vessel-like shape, the width W3 of the fourth trench 5d is set to be less than the width W2 of the third trench 5c. In other words, as depicted in FIGS. 2A, 2B, and 3A to 3D, the side walls of the third trench 5c contacting the area where the n-type emitter layer 7 is formed are expanded to about a width of the n-type emitter layer 7, on a side of the p-type base layer 4.

In the semiconductor device 100, with respect to this first n-type emitter layer 7, a second n-type emitter layer 7 is formed to sandwich the p-type base layer 4 with the first n-type emitter layer 7. The side walls of another third trench 5c adjacent to the third trench 5c mentioned above and contacting the second n-type emitter layer 7 is expanded, on a side of the p-type base layer 4. As a result, the width W2 of the third trench 5c becomes greater than the width W3 of the fourth trench 5d, enabling the width W3 of the fourth trench 5d to be relatively narrower than the width W2 of the third trench 5c.

Assuming a width of the first trench 5a is W1 and a width of the p-type base layer 4 is W4, a pitch (length of an interval at which the trench 5 is recursively disposed along the X direction) of the trench 5 of a direction orthogonal to a longitudinal direction of the trench 5 is assumed for all of the trenches 5 to be the same, W1+W4. Thus, an interval W5 of the third trench 5c becomes shorter than an interval W6 of the fourth trench 5d. In other words, the interval W5 of the third trench 5c of the place where the n-type emitter layer 7 is formed becomes narrower than the interval W6 of the fourth trench 5d. Making the width W3 of the fourth trench 5d narrow, enables gate capacitance and switching loss to be reduced compared to the IGBT 800 depicted in FIG. 37.

However, the third trench 5c and the fourth trench 5d are expanded, whereby the widths of the third trench 5c and the fourth trench 5d are also made wider than the width W1 of the first trench 5a. If the fourth trench 5d is not expanded and has the same width as the width W1 of the first trench 5a, electric field concentration at the fourth trench 5d easily occurs and dielectric breakdown of the second gate insulating film 6b may occur.

Further, expansion of the third trench 5c makes the width (interval of the third trench 5c) W5 of the n-type drift layer 3 between the third trenches 5c narrower than a width W4 of the p-type base layer 4. Therefore, the phenomenon of holes injected from the p-type collector layer 1 passing through the n-type drift layer 3 and the p-type base layer 4 and being drawn to the first p-type contact layer 8a becomes difficult and the holes injected from the p-type collector layer 1 accumulate in an upper portion of the n-type drift layer 3. Consequent to the accumulated holes, the amount of electrons injected into the n-type drift layer 3 through the channel increases (IE effect) and the ON voltage decreases.

A length ((W6−W5)/2) for expanding the side walls of the third trench 5c more than the fourth trench 5d may be shorter than a width of the n-type emitter layer 7 along a direction orthogonal to the longitudinal direction of the trench 5 (hereinafter, transverse direction). On the other hand, the length for expanding the side walls of the third trench 5c may be longer than the width of the n-type emitter layer 7 along the transverse direction of the trench 5.

Thus, holes injected from the p-type collector layer 1 become more attracted to the electrons injected from the n-type emitter layer 7 through a channel of a first trench 5a side wall of the p-type base layer 4. As a result, the hole density at the area sandwiched by the third trench 5c also increases, enabling the IE effect to be further strengthened. In addition, the holes drawn from the first p-type contact layer 8a are limited, the occurrence of latch up becomes difficult, and switching capability is improved.

In the description of the first embodiment, at the border of the third trench 5c and the fourth trench 5d in FIG. 2B, for the sake of simplicity, the widths of the respective trenches are depicted as rectangular shapes and are depicted to be connected and changing vertically. However, the shape of the border of the third trench 5c and the fourth trench 5d is not limited hereto. In particular, for example, as depicted by an enlarged view within a dotted-lined circle on the left side of FIG. 2B, the third trench 5c and the fourth trench 5d may be connected so as to form a slanted side wall surface, and the side wall surface may be curved and smoothly connected. Thus, the electric field concentration where the direction of the trench side wall changes may be eased.

As described, according to the semiconductor device 100 of the first embodiment, reduction of both ON voltage and switching loss is achieved and improved switching capability may be facilitated.

Further, according to the semiconductor device 100 of the first embodiment, the thickness of the second gate insulating film 6b and the thickness of the third gate insulating film 6c are greater than the thickness of the first gate insulating film 6a and therefore, compared to a case where the thickness of the second gate insulating film 6b and the thickness of the third gate insulating film 6c are the same as the thickness of the first gate insulating film 6a, the thickness of the accumulation layer becomes thin. If the thickness of the accumulation layer becomes thin, the resistivity of the accumulation layer becomes high. As a result, the flow of electrons is suppressed, whereby saturation current decreases, and short circuit capability improves.

In the semiconductor device 100, the junction portion 11 of the p-type base layer 4 and the n-type drift layer 3 may be positioned contacting the first gate insulating film 6a. The second gate insulating film 6b may be set to be the thickness of the first gate insulating film 6a, positioning the junction portion 11 to contact the second gate insulating film 6b. In either case, effects related to reduction of the ON voltage and to improved switching capability and switching loss are the same as the effects in the semiconductor device 100 described above.

Figure 4A:
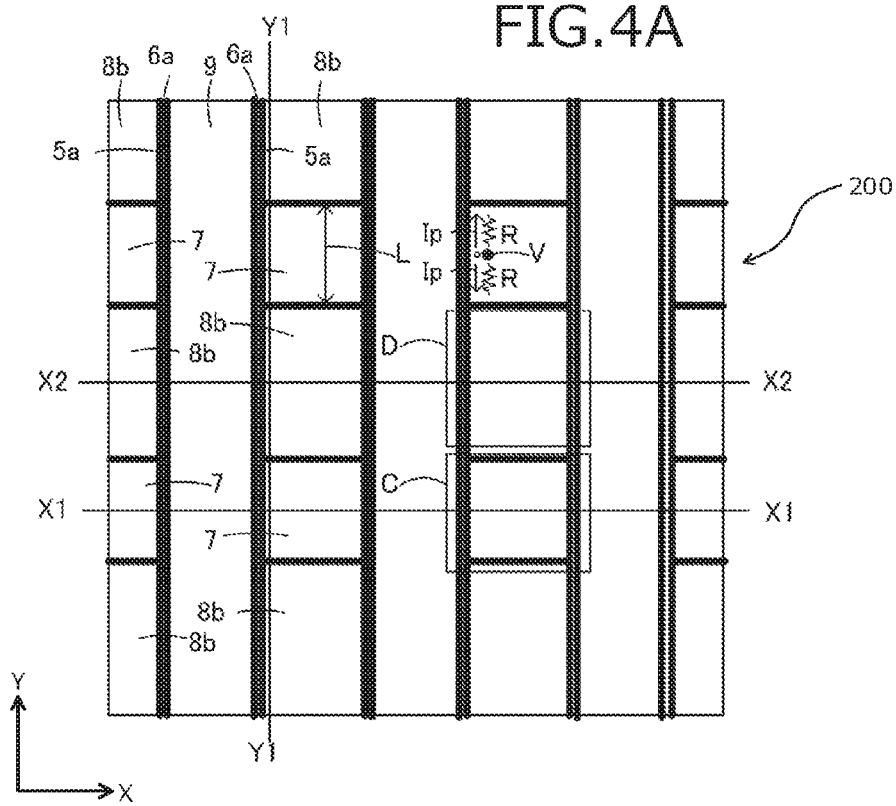
FIGS. 4A and 4B are plan views of a semiconductor device 200 according to a second embodiment.
Figure 4B:
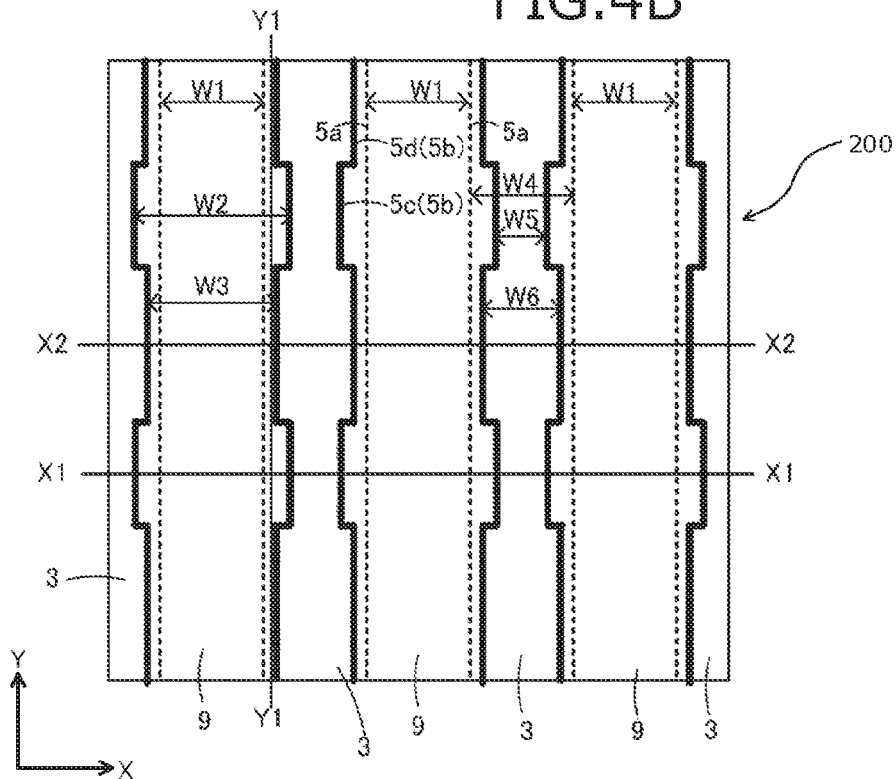

Configuration of a semiconductor device 200 according to a second embodiment of the present invention will be described. In the second embodiment, portions identical to those in the first embodiment are represented by the same reference signs used in the first embodiment and description thereof is omitted hereinafter. FIGS. 4A and 4B are plan views of the semiconductor device 200 according to the second embodiment. In FIGS. 4A and 4B, the semiconductor device 200 is depicted as viewed from a position corresponding to arrow A in FIG. 1. FIG. 4A depicts a layout of a main portion of the semiconductor device 200 and corresponds to FIG. 2A depicting the semiconductor device 100 of the first embodiment. FIG. 4B depicts a layout of a main portion of the semiconductor device 200 and corresponds to FIG. 2B depicting the semiconductor device 100 of the first embodiment.

Figure 5A:
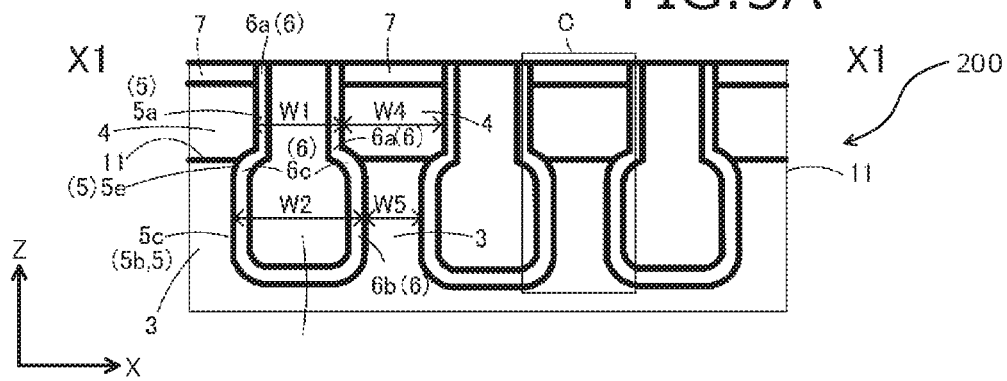
FIGS. 5A, 5B and 5C are cross-sectional views of a main portion of the semiconductor device 200 according to the second embodiment.
Figure 5B:
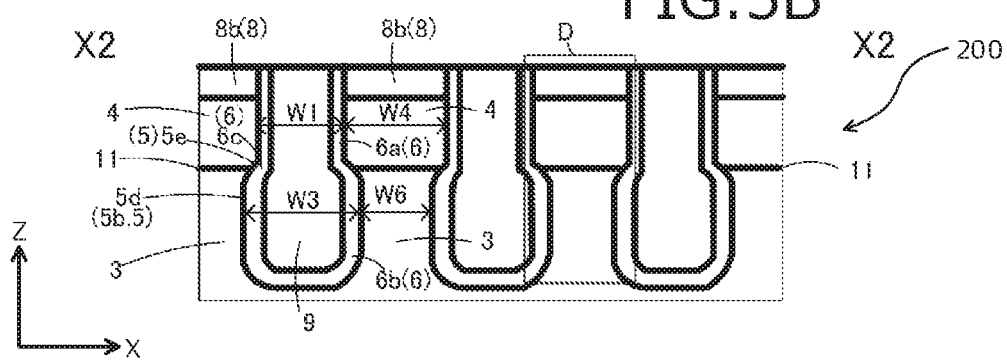
Figure 5C:
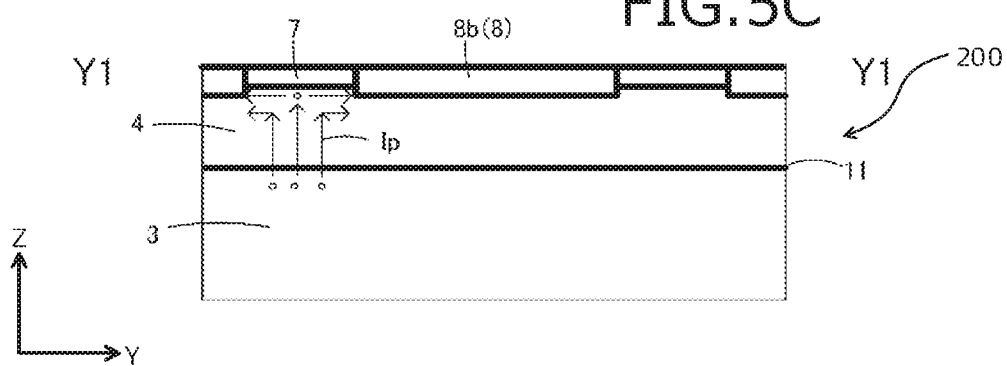

FIGS. 5A, 5B and 5C are cross-sectional views of a main portion of the semiconductor device 200 according to the second embodiment. FIG. 5A depicts a cross-section of the semiconductor device 200 cut along cutting line X1-X1 depicted in FIGS. 4A and 4B. FIG. 5B depicts a cross-section cut along cutting line X2-X2 depicted in FIGS. 4A and 4B. FIG. 5C depicts a cross-section of a main portion of the semiconductor device 200 cut along cutting line Y1-Y1 depicted in FIGS. 4A and 4B.

As depicted in FIGS. 4A, 4B, and 5A to 5C, the semiconductor device 200 according to the second embodiment, differs from the semiconductor device 100 of the first embodiment in that the first p-type contact layer 8a is not provided and the n-type emitter layer 7 is connected along the X direction, as depicted in FIG. 5A. Such configuration is useful when the width W4 of the p-type base layer 4 is narrow, that is, when the interval between adjacent trenches 5 is narrow. When the interval between adjacent trenches 5 is wide, the first p-type contact layer 8a may be provided similarly as in FIG. 1.

On the p-type base layer 4 of the area where the n-type emitter layer 7 is not disposed, the p-type contact layer 8 (the second p-type contact layer 8b) is disposed as depicted in FIG. 5B. In the semiconductor device 200 of the second embodiment, the fourth semiconductor layer according to the present disclosure is implemented by the p-type contact layer 8 (the second p-type contact layer 8b). In FIGS. 4A and 5A, reference sign C indicates an area where the n-type emitter layer 7 is formed. Further, in FIGS. 4A, and 5B, reference sign D indicates an area where along the Y direction, the n-type emitter layer 7 is segmented and the n-type emitter layer 7 is not formed.

In the semiconductor device 200, similar to the semiconductor device 100 of the first embodiment, the third trench 5c and the fourth trench 5d are expanded into a vessel-like shape, and the width W3 of the fourth trench 5d is narrower than the width W2 of the third trench 5c. In other words, the side walls of the third trench 5c contacting the area where the n-type emitter layer 7 is formed are expanded on a side of the p-type base layer 4. The side walls of another third trench 5c adjacent to the third trench 5c and contacting the n-type emitter layer 7 are also expanded on a side of the p-type base layer 4. As a result, the width W2 of the third trench 5c becomes wider than the width W3 of the fourth trench 5d.

The pitch along a direction of the width of the trench 5 is assumed for all of the trenches 5 to be the same, W1+W4. As a result, the interval W5 of the third trench 5c is shorter than the interval W6 of the fourth trench 5d. In other words, the interval W5 of the third trench of the area where the n-type emitter layer 7 is formed is narrower than the interval W6 of the fourth trench 5d.

The length ((W6−W5)/2) for expanding the side walls of the third trench 5c more than the side walls of the fourth trench 5d may be longer than a length ((W4−W5)/2) that the fourth trench 5d is expanded with respect to the first trench 5a. Thus, holes injected from the p-type collector layer 1 become more attracted to the electrons injected from the n-type emitter layer 7 through the channel of the first trench 5a side wall of the p-type base layer 4. As a result, the hole density at an area sandwiched by the third trenches 5c also increases, enabling the IE effect to be further enhanced.

In the semiconductor device 100 of the first embodiment, the length ((W6−W5)/2) for expanding the side walls of the third trench 5c more than the fourth trench 5d may be longer than the length ((W4−W5)/2) that the fourth trench 5d is expanded with respect to the first trench 5a.

In the semiconductor device 200, holes flowing into the p-type base layer 4 directly below the n-type emitter layer 7 pass through the p-type base layer 4 directly below the n-type emitter layer 7 and the second p-type contact layer 8b. Here, voltage drop V occurs by a product of hole flow Ip of the p-type base layer 4 below the n-type emitter layer 7 and transverse resistivity R of the p-type base layer 4. When the voltage drop V exceeds 0.6V to 0.7 V with the electric potential of the second p-type contact layer 8b as reference, electrons flow from the n-type emitter layer 7 to the p-type base layer, whereby latch up occurs. Therefore, a length L of the n-type emitter layer 7 along the Y direction has to be shorted and the voltage drop V reduced. The length L is dependent on the impurity concentration of the p-type base layer 4. The length L may be, for example, about 0.5 μm to 1 μm.

As described, according to the semiconductor device 200 of the second embodiment, reduction of both ON voltage and switching loss is achieved, and improved switching capability may be facilitated.

Configuration of a semiconductor device 300 according to a third embodiment of the present invention will be described. In the third embodiment, portions identical to those in the first embodiment and the second embodiment are represented by the same reference signs used in the first and second embodiments, and description thereof is omitted hereinafter.

Figure 6A:
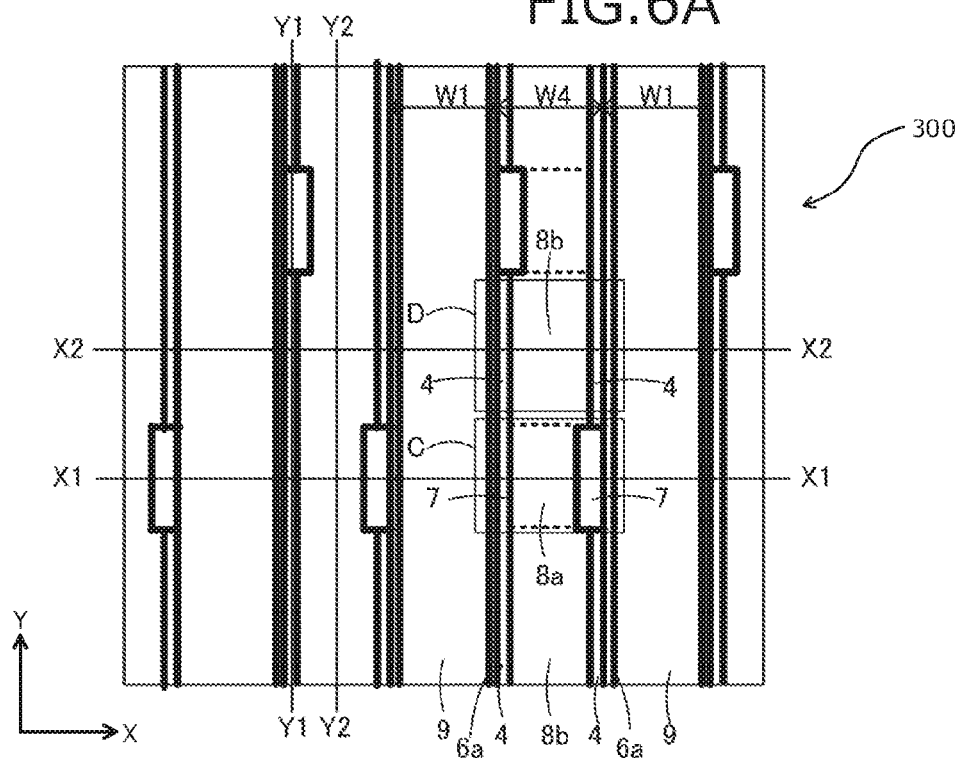
FIGS. 6A and 6B are plan views of a semiconductor device 300 according to a third embodiment.
Figure 6B:
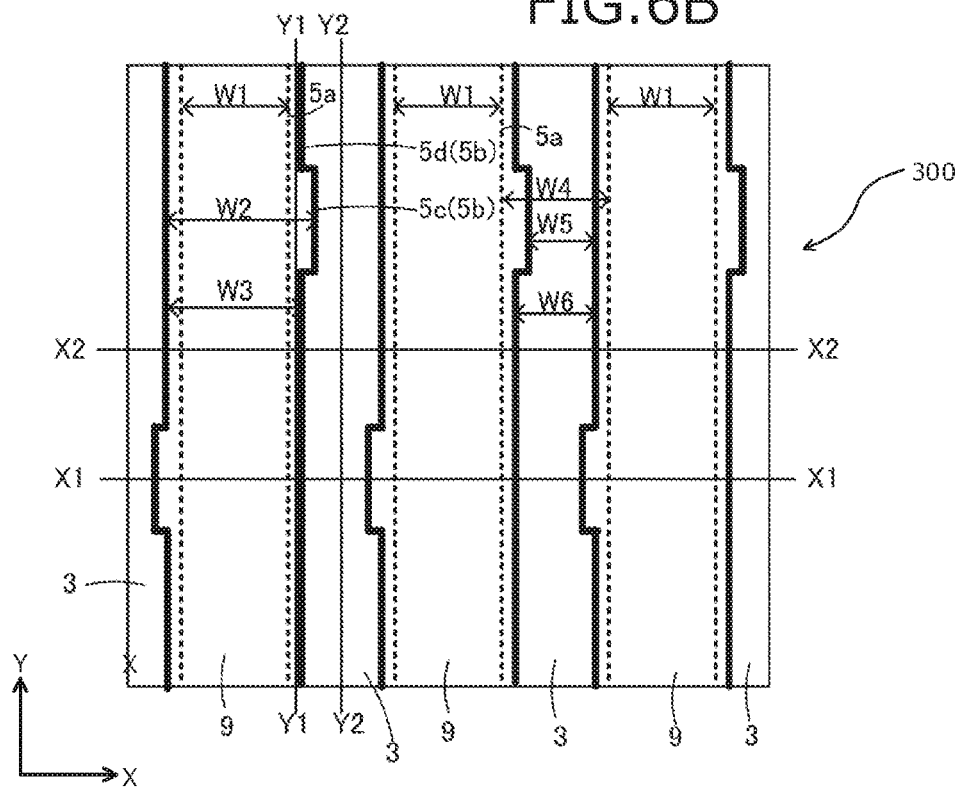

FIGS. 6A and 6B are plan views of the semiconductor device 300 according to the third embodiment. In FIGS. 6A and 6B, the semiconductor device 300 is depicted as viewed from a position corresponding to arrow A in FIG. 1. FIG. 6A depicts a layout of a main portion of the semiconductor device 300 and corresponds to FIG. 2A depicting the semiconductor device 100 of the first embodiment. FIG. 6B depicts a layout of a main portion of the semiconductor device 300 and corresponds to FIG. 2B depicting the semiconductor device 100 of the first embodiment.

Figure 7A:
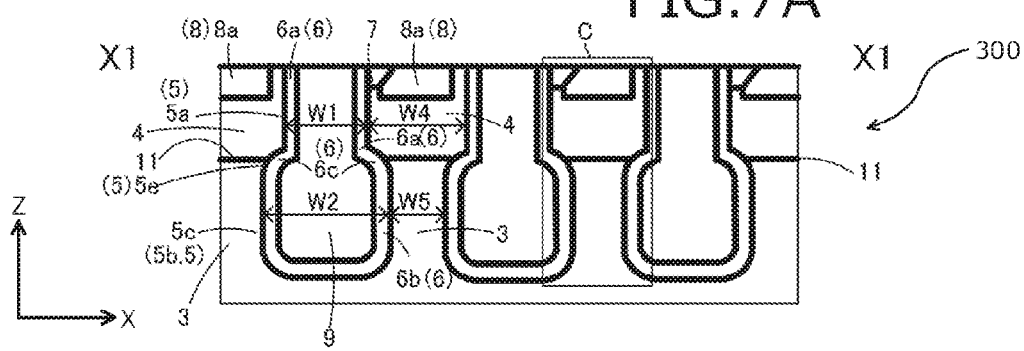
FIGS. 7A, 7B, 7C, and 7D are cross-sectional views of a main portion of the semiconductor device 300 according to the third embodiment.
Figure 7B:
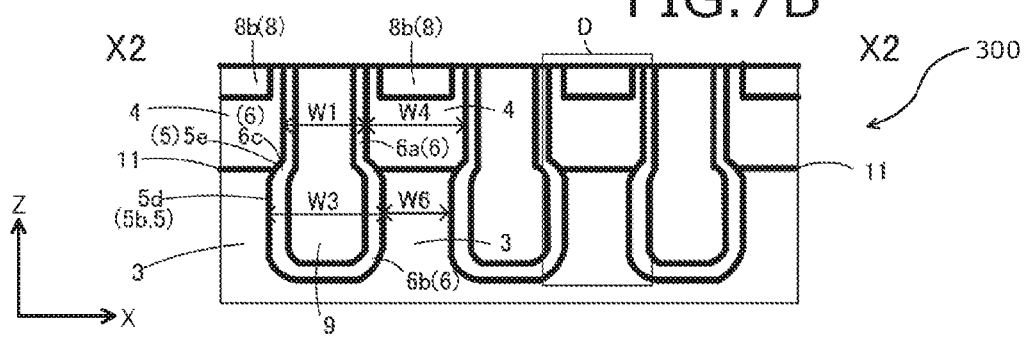
Figure 7C:
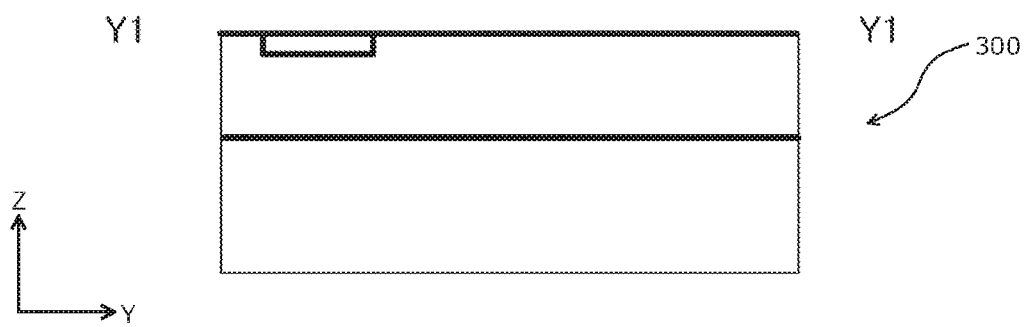
Figure 7D:

FIGS. 7A, 7B, 7C, and 7D are cross-sectional views of a main portion of the semiconductor device 300 according to the third embodiment. FIGS. 7A to 7D correspond to FIGS. 3A to 3D depicting the semiconductor device 100 of the first embodiment. FIG. 7A depicts a cross-sectional view along cutting line X1-X1 depicted in FIGS. 6A and 6B. FIG. 7B depicts a cross-section cut along cutting line X2-X2 depicted in FIGS. 6A and 6B. FIG. 7C depicts a cross-section of a main portion cut along cutting line Y1-Y1 depicted in FIGS. 6A and 6B. FIG. 7D depicts a cross-section of a main portion cut along cutting line Y2-Y2 depicted in FIGS. 6A and 6B.

In FIGS. 6A, 6B, and 7A to 7D, the semiconductor device 300 according to the third embodiment differs from the semiconductor device 100 of the first embodiment in that the facing n-type emitter layers 7 sandwiching the first p-type contact layer 8a along the X direction in the semiconductor device 100 are disposed alternately. In FIGS. 6A and 7A, reference sign C indicates the area where the n-type emitter layer 7 is formed. Further, in FIGS. 6A and 7B, reference sign D indicates the area where along the Y direction, the n-type emitter layer 7 is segmented and the n-type emitter layer 7 is not formed.

Figure 37:
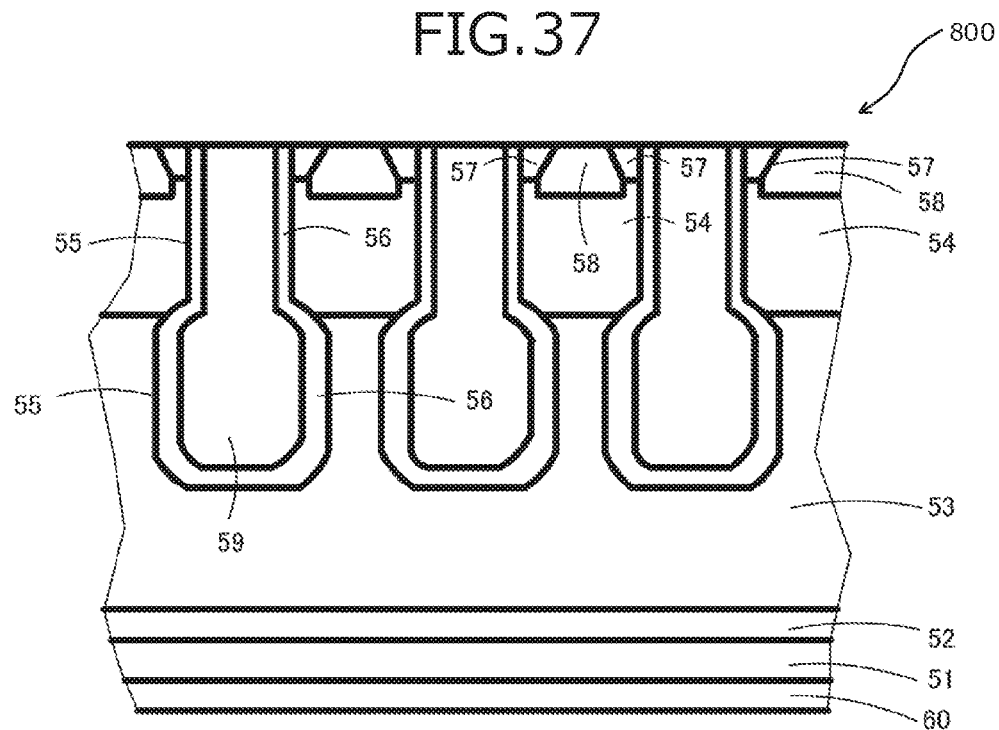
FIG. 37 is a cross-sectional view of a main portion of a conventional IGBT 800 in which a lower portion of a trench gate structure has been expanded.

Thus, in the semiconductor device 300, the gate capacitance is less than that of the conventional IGBT 800 depicted in FIG. 37 described above, enabling switching loss to be decreased. Further, in the semiconductor device 300, the n-type drift layer below the n-type emitter layer becomes narrow, whereby the ON voltage may be reduced by the IE effect.

As described, according to the semiconductor device 300 of the third embodiment, reduction of both the ON voltage and switching loss is achieved, and improved switching capability may be facilitated.

Figure 8A:
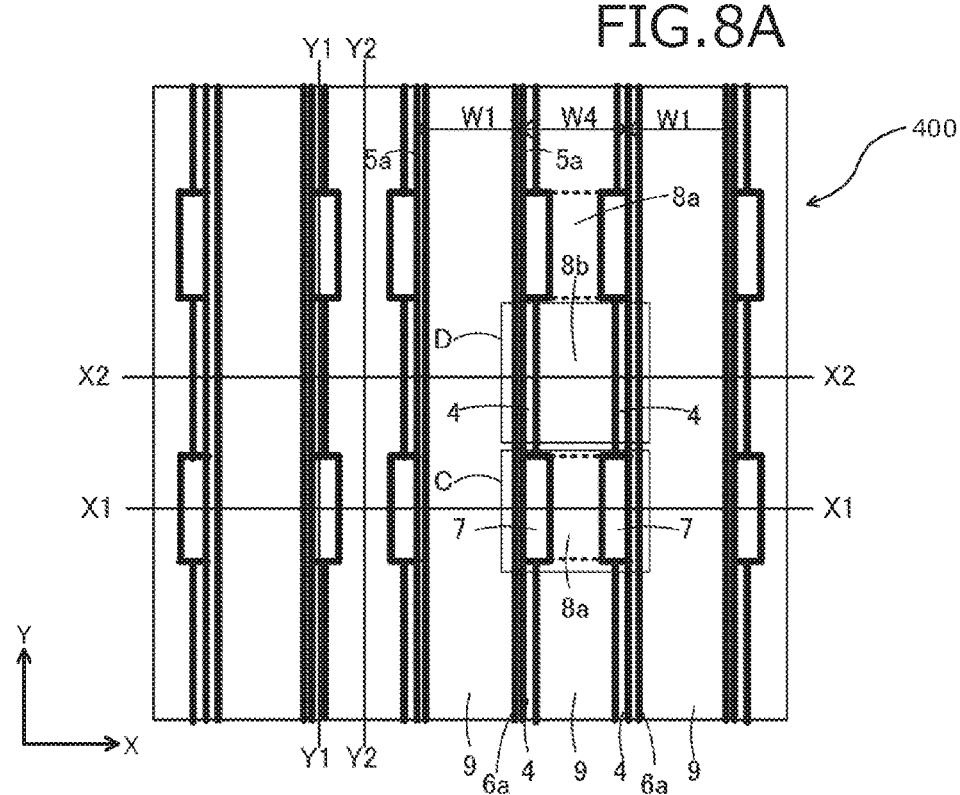
FIGS. 8A and 8B are plan views of a semiconductor device 400 according to a fourth embodiment.
Figure 8B:
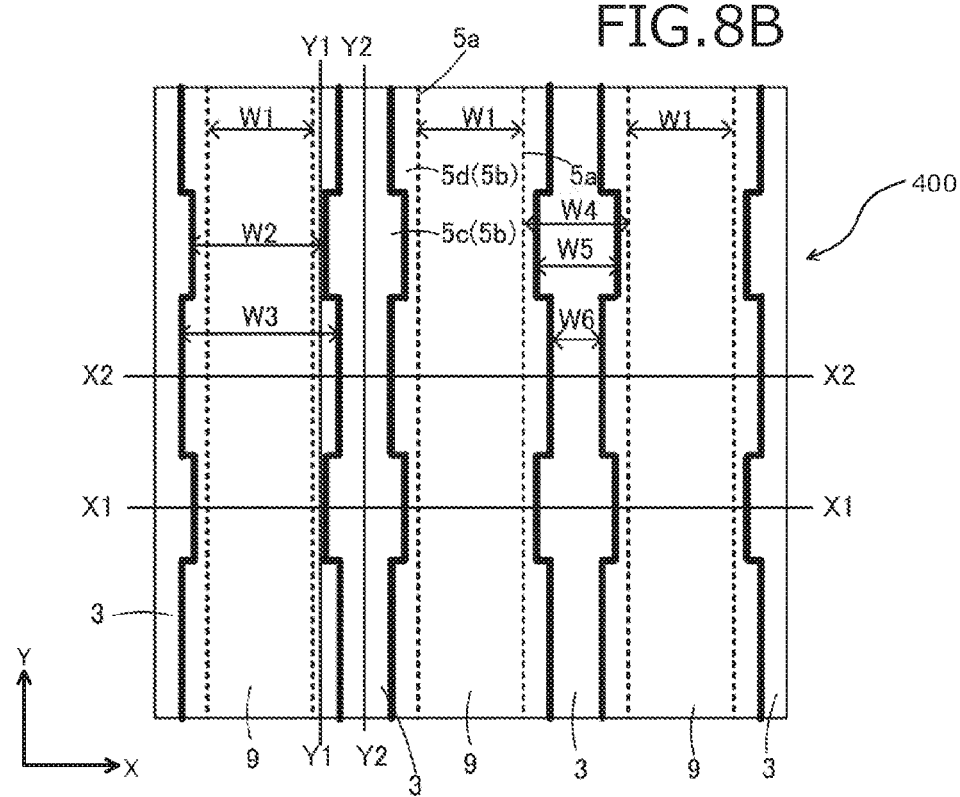

Configuration of a semiconductor device 400 according to a fourth embodiment of the present invention will be described. In the fourth embodiment, portions identical to those in the first to third embodiments are represented by the reference signs used in the first to third embodiments, and description thereof is omitted hereinafter. FIGS. 8A and 8B are plan views of the semiconductor device 400 according to the fourth embodiment. In FIGS. 8A and 8B, the semiconductor device 400 according to the fourth embodiment is depicted as viewed from a position corresponding to arrow A in FIG. 1. FIG. 8A corresponds to FIG. 2A and depicts a layout of a main portion of the semiconductor device 400 according to the fourth embodiment. FIG. 8B corresponds to FIG. 2B and depicts a layout of a main portion of the semiconductor device 400 according to the fourth embodiment.

Figure 9A:
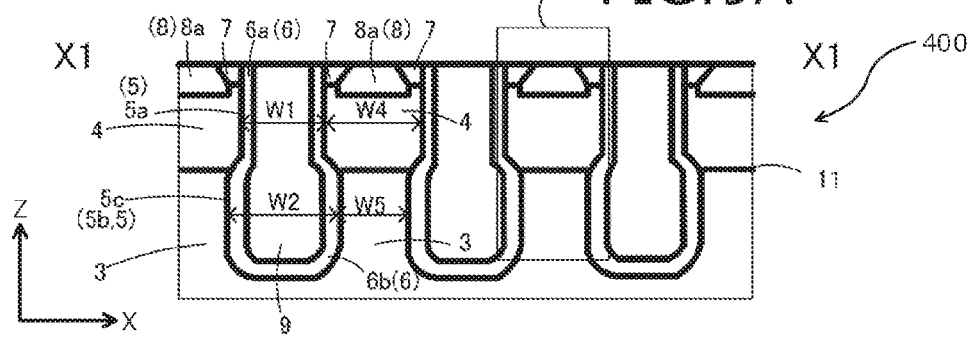
FIGS. 9A, 9B, 9C, and 9D are cross-sectional views of a main portion of the semiconductor device 400 according to the fourth embodiment.
Figure 9B:
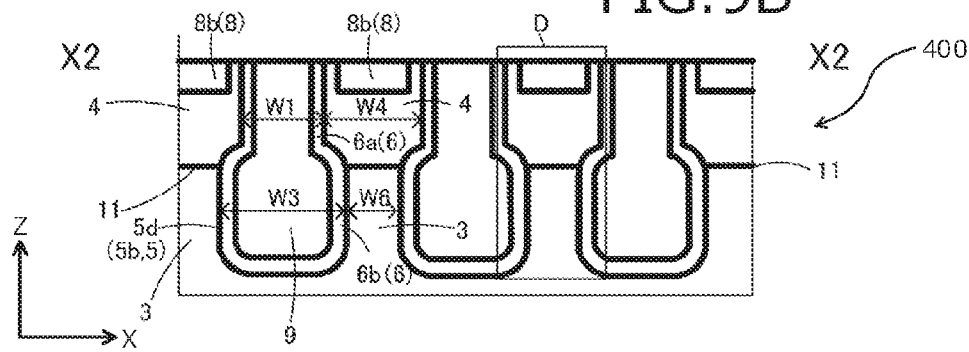
Figure 9C:
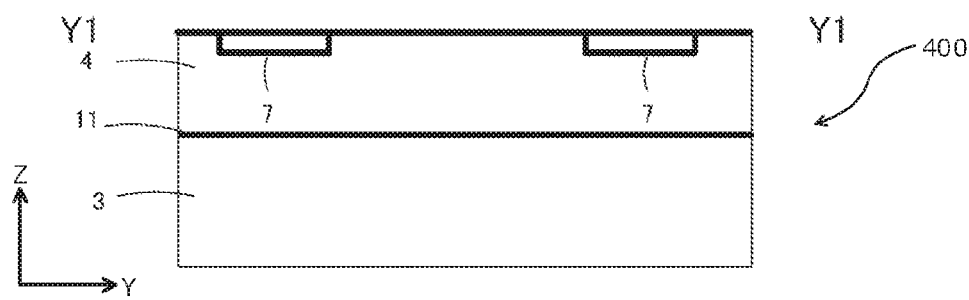
Figure 9D:
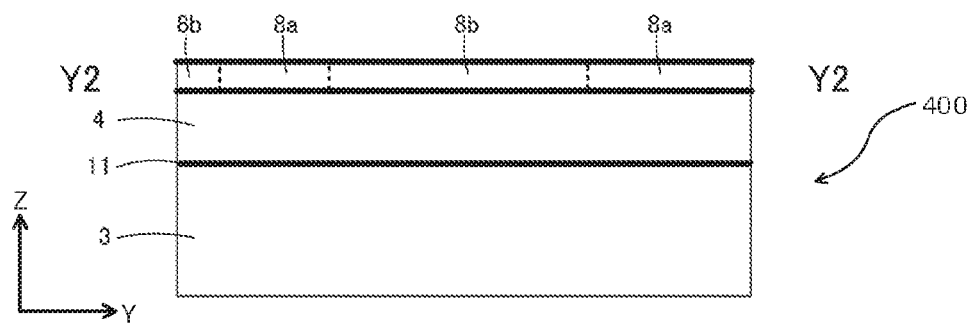

FIGS. 9A, 9B, 9C, and 9D are cross-sectional views of a main portion of the semiconductor device 400 according to the fourth embodiment and correspond to FIGS. 3A to 3D depicting the semiconductor device 100 of the first embodiment. FIG. 9A depicts a cross-section cut along cutting line X1-X1 depicted in FIGS. 8A and 8B. FIG. 9B depicts a cross-section cut along cutting line X2-X2 depicted in FIGS. 8A and 8B. FIG. 9C depicts a cross-section of a main portion cut along cutting line Y1-Y1 depicted in FIGS. 8A and 8B. FIG. 9D depicts a cross-section of a main portion cut along cutting line Y2-Y2 depicted in FIGS. 8A and 8B.

As depicted in FIGS. 8A, 8B, and 9A to 9D, the semiconductor device 400 according to the fourth embodiment differs from the semiconductor device 100 of the first embodiment in that the width W2 of the third trench 5c is narrower than the width W3 of the fourth trench 5d. In the semiconductor device 400, the relationship of the width W2 of the third trench 5c and the width W3 of the fourth trench 5d is opposite to the relationship between the width W2 of the third trench 5c and the width W3 of the fourth trench 5d in the semiconductor device 100 depicted in FIG. 1.

In other words, in the semiconductor device 400, the side walls of the fourth trench 5d contacting the area where the n-type emitter layer 7 is not formed are expanded by about the width of the n-type emitter layer 7, on a side of the p-type base layer 4. A second n-type emitter layer 7 is formed to face this n-type emitter layer 7 and sandwich the p-type base layer 4 in between. The side walls of a second fourth trench 5d adjacent to the fourth trench 5d and contacting the area where the second n-type emitter layer 7 is not formed are also expanded on the side of the p-type base layer 4 mentioned above.

Thus, the width W3 of the fourth trench 5d becomes wider than the width W2 of the third trench 5c. In FIGS. 8A and 9A, reference sign C indicates the area where the n-type emitter layer is formed and in FIGS. 8A and 9B, reference sign D indicates the area segmenting the n-type emitter layer and where the n-type emitter layer is not formed. Further, the transverse direction pitch of the trench 5 is assumed to be the same, W1+W4, for all the trenches 5. Thus, the interval W6 of the fourth trench 5d is made shorter than the interval W5 of the third trench 5c, i.e., the interval W6 of the fourth trench 5d of the area where the n-type emitter layer 7 is not formed is narrower than the interval W5 of the third trench 5c.

The semiconductor device 400 has lower gate capacitance as compared to the IGBT 800 depicted in FIG. 37, whereby switching loss becomes smaller. Meanwhile, in the semiconductor device 400, since the width W2 of the third trench 5c is narrower than the width W3 of the fourth trench 5d, the IE effect at the n-type drift layer 3 below the n-type emitter layer 7 smaller than in the case of the semiconductor device 100 in FIG. 1. Therefore, although the semiconductor device 400 has a slightly higher ON voltage compared to the semiconductor device 100 in FIG. 1, the ON voltage may be reduced compared to the conventional IGBT in FIG. 37.

Figure 10A:
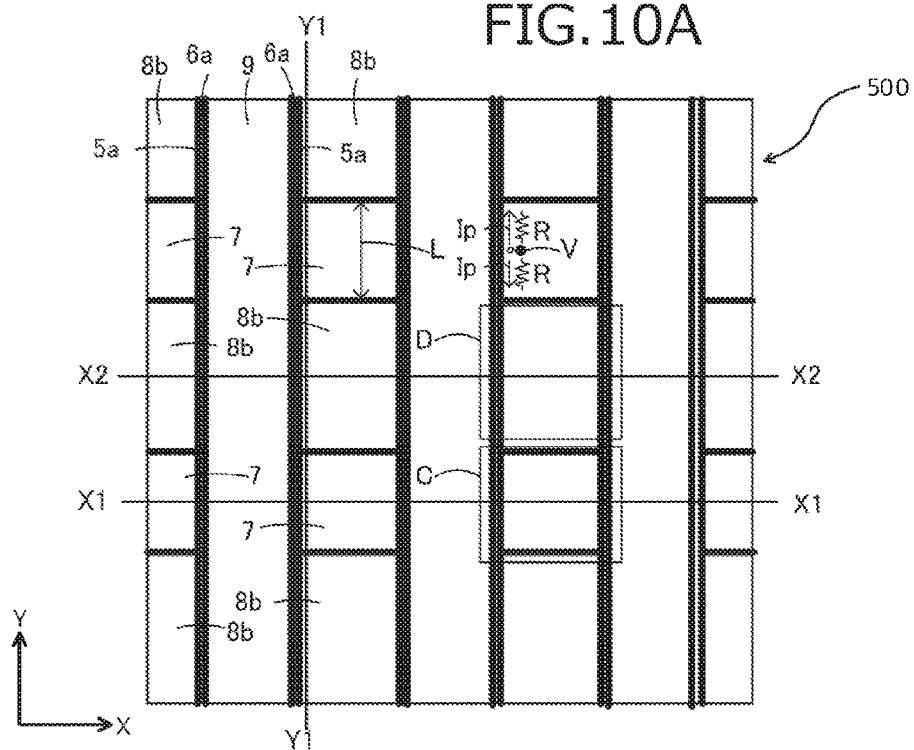
FIGS. 10A and 10B are plan views of a semiconductor device 500 according to a fifth embodiment.
Figure 10B:
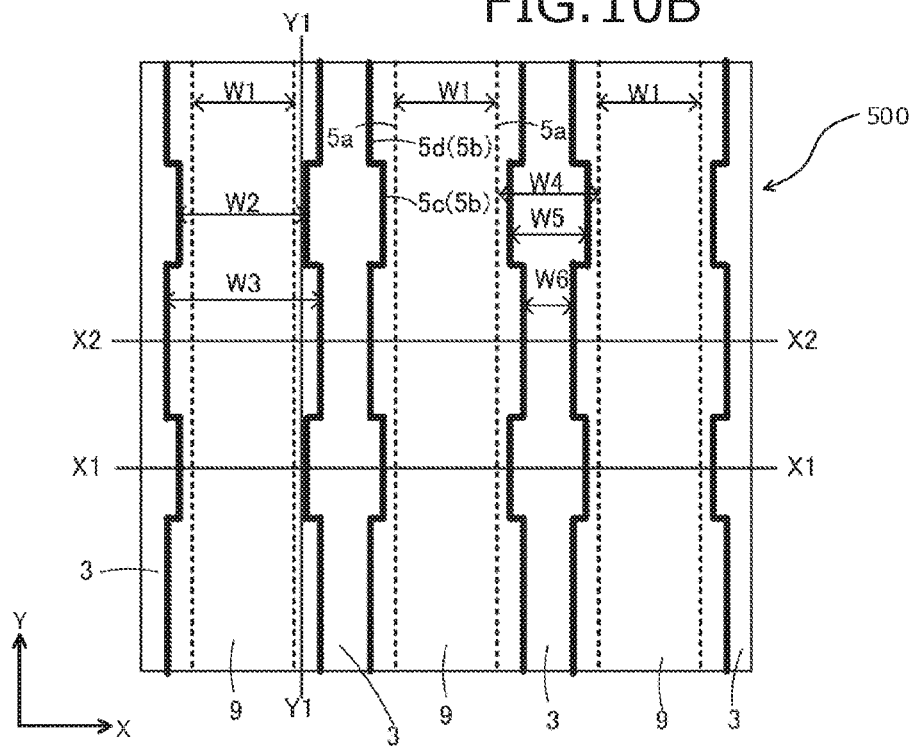

Configuration of a semiconductor device 500 according to a fifth embodiment of the present invention will be described. In the fifth embodiment, portions identical to those in the first to fourth embodiments are represented by the same reference signs used in the first to fourth embodiments, and description thereof is omitted hereinafter. FIGS. 10A and 10B are plan views of the semiconductor device 500 according to the fifth embodiment.

FIGS. 10A and 10B depict the semiconductor device 500 according to the fifth embodiment as viewed from a position corresponding to arrow A in FIG. 1 and correspond to FIGS. 4A and 4B depicting the semiconductor device 200 of the second embodiment. FIG. 10A depicts a layout of a main portion of the semiconductor device 500 and corresponds to FIG. 4A depicting the semiconductor device 200 of the second embodiment. FIG. 10B depicts a layout of a main portion of the semiconductor device 500 and corresponds to FIG. 4B depicting the semiconductor device 200 of the second embodiment.

Figure 11A:
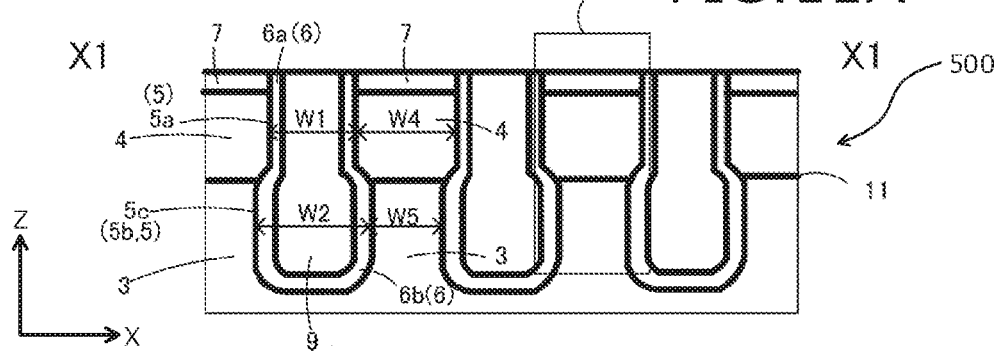
FIGS. 11A, 11B, and 11C are cross-sectional views of a main portion of the semiconductor device 500 according to the fifth embodiment.
Figure 11B:
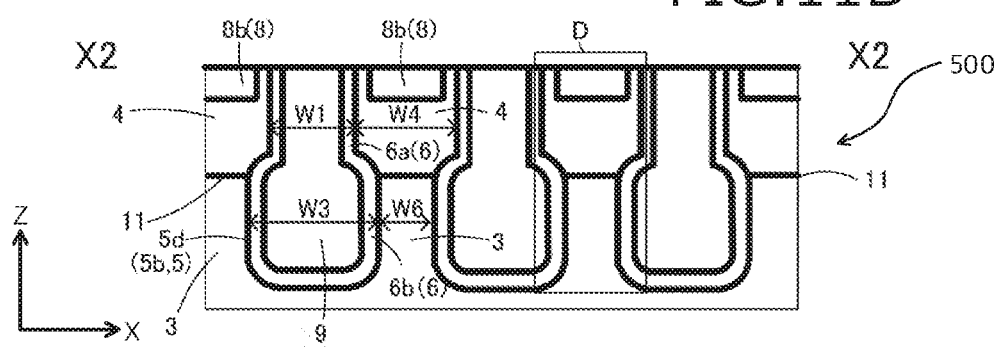
Figure 11C:
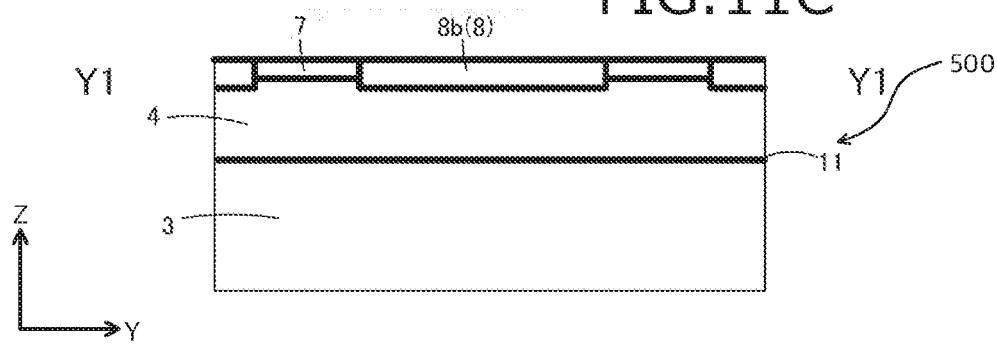

FIGS. 11A, 11B, and 11C are cross-sectional views of a main portion of the semiconductor device 500 according to the fifth embodiment and correspond to FIGS. 5A to 5C depicting the semiconductor device 200 of the second embodiment. FIG. 11A depicts a cross-section cut along cutting line X1-X1 depicted in FIGS. 10A and 10B. FIG. 11B depicts a cross-section cut along cutting line X2-X2 depicted in FIGS. 10A and 10B. FIG. 11C depicts a cross-sectional view of a main portion cut along cutting line Y1-Y1 depicted in FIGS. 10A and 10B. In FIGS. 10A and 11A, reference sign C indicates the area where the n-type emitter layer 7 is formed; and in FIGS. 10A and 11B, reference sign D indicates the area segmenting the n-type emitter layer 7 and where the n-type emitter layer 7 is not formed.

As depicted in FIGS. 10A, 10B, and 11A to 11C, the semiconductor device 500 according to the fifth embodiment differs from the semiconductor device 200 of the second embodiment depicted in FIGS. 4A and 4B in that the width W2 of the third trench 5c is narrower than the width W3 of the fourth trench 5d. In the semiconductor device 500, the relationship of the width W2 of the third trench 5c and the width W3 of the fourth trench 5d is opposite the relationship of the width W2 of the third trench 5c and the width W3 of the fourth trench 5d in the semiconductor device 200 of the second embodiment depicted in FIGS. 4A and 4B.

In the semiconductor device 500, similar to the semiconductor device 400 of the fourth embodiment, with the expansion of the third trench 5c and the fourth trench 5d into a vessel-like shape, the width W2 of the third trench 5c becomes narrower than the width W3 of the fourth trench 5d, i.e., in the semiconductor device 500, as depicted in FIGS. 10A, 10B, and 11A to 11C, the side walls of the fourth trench 5d contacting the area where the n-type emitter layer 7 is not formed is expanded on a side of the p-type base layer 4. The side walls of another fourth trench 5d adjacent to the fourth trench 5d and not contacting this n-type emitter layer 7 are also expanded on the side of the p-type base layer 4 mentioned above.

Thus, the width W3 of the fourth trench 5d becomes wider than the width W2 of the third trench 5c. Further, the transverse direction pitch of the trench 5 is assumed to be the same, W1+W4, for all of the trenches 5. As a result, the interval W6 of the fourth trench 5d is made shorter than the interval W5 of the third trench 5c, i.e., the interval W6 of the fourth trench of the area where the n-type emitter layer 7 is not formed becomes narrower than the interval W5 of the third trench 5c.

The semiconductor device 500 has lower gate capacitance as compared to the IGBT 800 depicted in FIG. 37, whereby switching loss becomes smaller. Meanwhile, in the semiconductor device 500, since the width W2 of the third trench 5c becomes narrower than the width W3 of the fourth trench 5d, the IE effect at the n-type drift layer 3 below the n-type emitter layer 7 becomes smaller in than the case of the semiconductor device 200 in FIGS. 4A and 4B. Therefore, although the semiconductor device 500 has a slightly higher ON voltage compared to the semiconductor device 200 in FIGS. 4A and 4B, the ON voltage may be reduced compared to the conventional IGBT in FIG. 37.

Figure 12A:
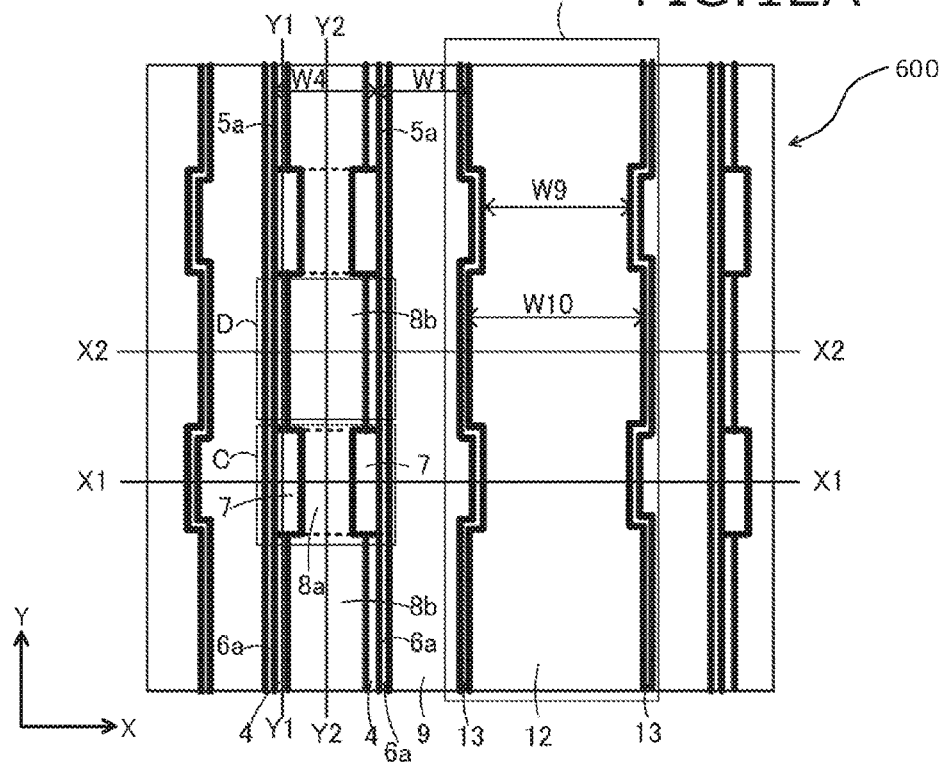
FIGS. 12A and 12B are plan views of a semiconductor device 600 according to a sixth embodiment.
Figure 12B:
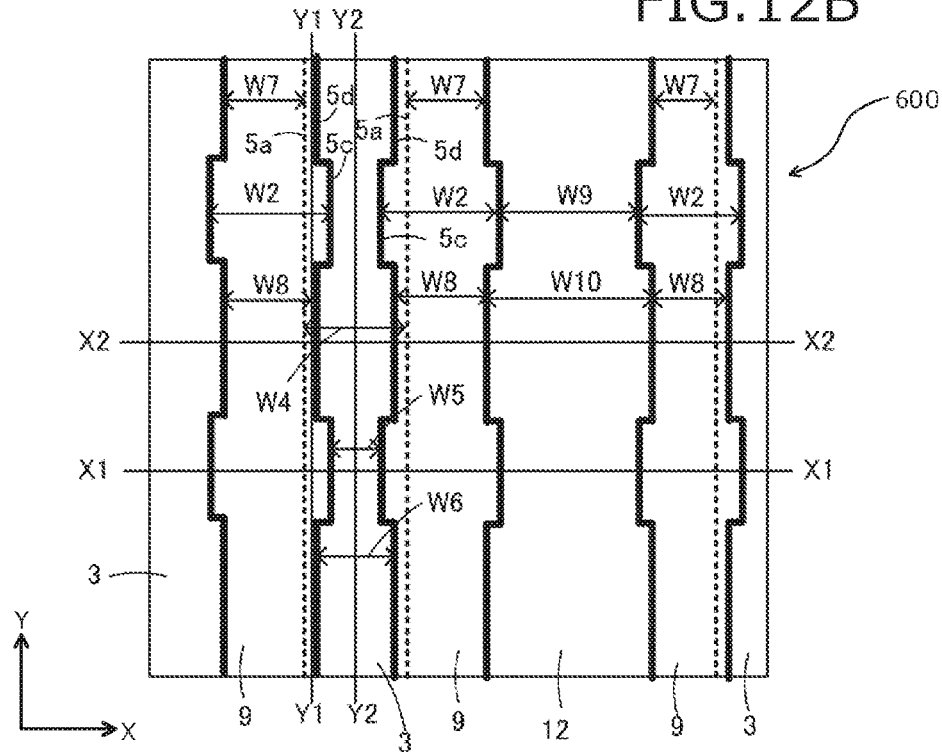

Configuration of a semiconductor device 600 according to a sixth embodiment of the present invention will be described. In the sixth embodiment, portions identical to those in the first to fifth embodiments are represented by the same reference signs used in the first to fifth embodiments, and description thereof is omitted hereinafter. FIGS. 12A and 12B are plan views of the semiconductor device 600 according to the sixth embodiment.

In FIGS. 12A and 12B, the semiconductor device 600 according to the sixth embodiment is depicted as viewed from a position corresponding to arrow A in FIG. 1. FIG. 12A depicts a layout of a main portion of the semiconductor device 600 according to the sixth embodiment and corresponds to FIG. 2A depicting the semiconductor device 100 of the first embodiment. FIG. 12B depicts a layout of a main portion of the semiconductor device 600 according to the sixth embodiment and corresponds to FIG. 2B depicting the semiconductor device 100 of the first embodiment.

Figure 13A:
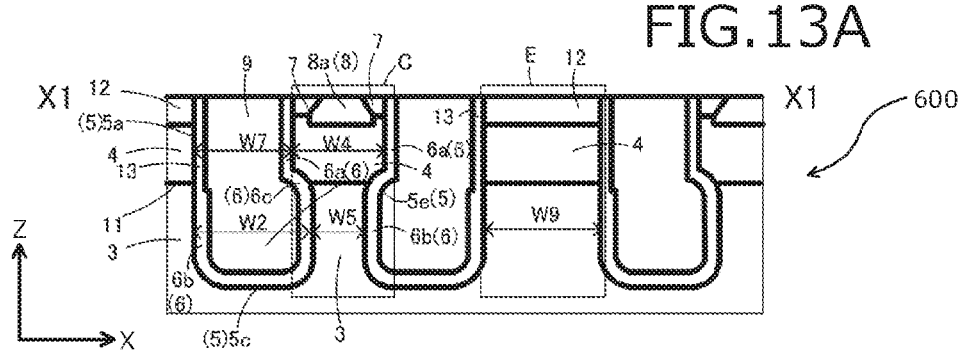
FIGS. 13A, 13B, 13C, and 13D are cross-sectional views of a main portion of the semiconductor device 600 according to the sixth embodiment.
Figure 13B:
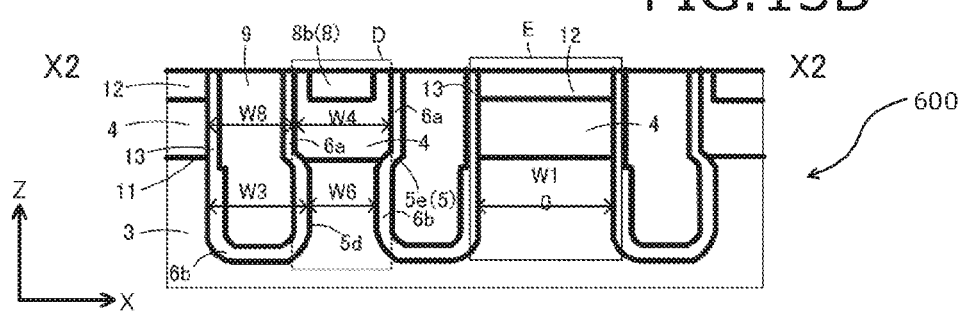
Figure 13C:
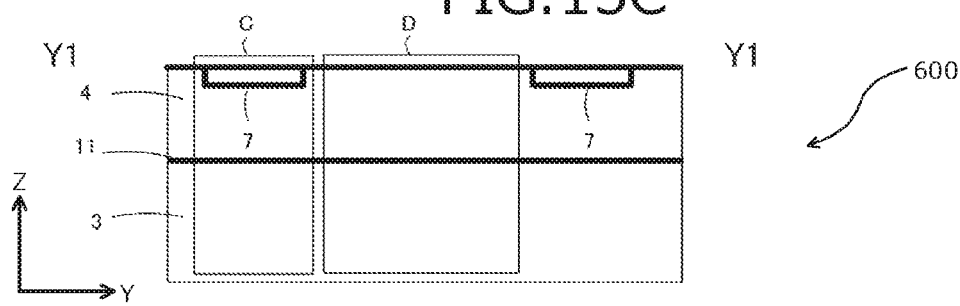
Figure 13D:
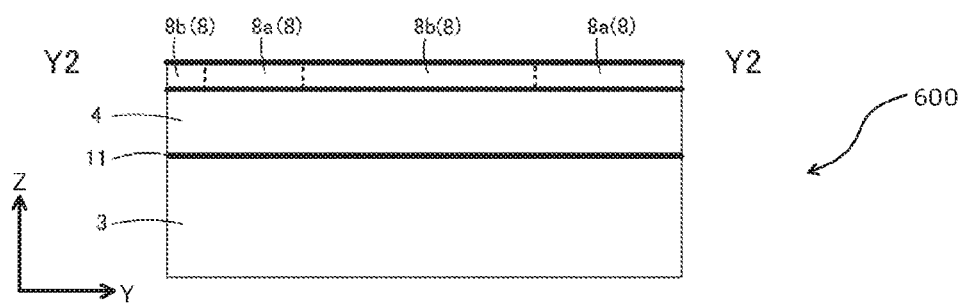

FIGS. 13A, 13B, 13C, and 13D are cross-sectional views of a main portion of the semiconductor device 600 according to the sixth embodiment. FIGS. 13A to 13D correspond to FIGS. 3A to 3D depicting the semiconductor device 100 of the first embodiment. FIG. 13A depicts a cross-section cut along cutting line X1-X1 depicted in FIGS. 12A and 12B. FIG. 13B depicts a cross-section cut along cutting line X2-X2 depicted in FIGS. 12A and 12B. FIG. 13C depicts a cross-section of a main portion cut along cutting line Y1-Y1 depicted in FIGS. 12A and 12B. FIG. 13D depicts a cross-sectional view of a main portion cut along cutting line Y2-Y2 depicted in FIGS. 12A and 12B.

As depicted in FIGS. 12A, 12B, and 13A to 13D, the semiconductor device 600 according to the sixth embodiment differs from the semiconductor device 100 of the first embodiment in that the semiconductor device 600 has a floating portion E. In FIGS. 13A and 13B, reference sign E indicates an area where a floating portion is formed. In FIGS. 12A, 13A, and 13C, reference sign C indicates the area where the n-type emitter layer 7 is formed. Further, in FIGS. 12A, 13B, and 13C, reference sign D indicates the area where the n-type emitter layer 7 is segmented and the n-type emitter layer 7 is not formed.

The striped p-type base layer 4 where the floating portion E is formed is disposed alternately along the X direction with the striped p-type base layer 4 where the n-type emitter portion C and the contact portion D are formed. Alternatively, the striped p-type base layer 4 where the floating portion E is formed may be formed along the X direction, for every few of the striped p-type base layers 4 where the n-type emitter portion C and the contact portion D are formed.

The semiconductor device 600 has the p-type collector layer 1, the n-type buffer layer 2, the n-type drift layer 3, the p-type base layer 4, and the trenches 5, similar to the semiconductor device 100 depicted in FIG. 1. The n-type buffer layer 2 is disposed on the p-type collector layer 1. The n-type drift layer 3 is disposed on the n-type buffer layer 2. The p-type base layer 4 is disposed on the n-type drift layer 3. The trenches 5 penetrate the p-type base layer 4 and reach the n-type drift layer 3. The trenches 5 form long stripes along the Y direction and are disposed in plural aligned along the X direction.

The semiconductor device 600 includes the n-type emitter layer 7 and the contact layer 8. The n-type emitter layer 7 is disposed on the p-type base layer 4 and contacts a first side wall of the trench 5. The contact layer 8 includes the first p-type contact layer 8a and the second p-type contact layer 8b. The first p-type contact layer 8a, along the X direction, separates the n-type emitter layers 7 and reaches the p-type base layer 4. The second p-type contact layer 8b, along the Y direction, separates the n-type emitter layer 7 and is connected to the p-type base layer 4.

The semiconductor device 600 has a high-concentration p-type layer 12. The high-concentration p-type layer 12 contacts a second side wall of the trench 5 and configures the floating portion E disposed on the p-type base layer 4, where the n-type emitter layer 7 is not disposed. The floating portion E is configured by the p-type base layer 4 where the n-type emitter layer 7 is not disposed and the high-concentration p-type layer 12 on the p-type base layer 4 where the n-type emitter layer 7 is not disposed, and is in a floating potential state.

The p-type base layer 4 of the floating portion E is formed every other or every few of the p-type base layers 4 where the n-type emitter layer 7 is formed. The high-concentration p-type layer 12 is not always necessary and the high-concentration p-type layer 12 of the floating portion E may not be formed in some cases.

The semiconductor device 600 includes the gate insulating film 6, the gate electrode 9, the interlayer insulating film (not depicted), the emitter electrode (not depicted), and the collector electrode 10. The gate insulating film 6 covers the inner wall of the trench 5. The gate electrode 9 is disposed embedded via the gate insulating film 6. The interlayer insulating film covers the top of the gate electrode 9. The emitter electrode is connected to the n-type emitter layer 7 and the p-type contact layer 8 via a contact hole formed in the interlayer insulating film. The collector electrode 10 is connected to the p-type collector layer 1.

The trench is configured by the first trench 5a and the second trench 5b disposed sequentially from the surface, along the Z direction. In other words, the trench 5 is configured by two steps, the first trench 5a and the second trench 5b. Along the Z direction, the first trench 5a is disposed on the surface side and the second trench 5b is disposed a position deeper than the first trench 5a. The width of the second trench 5b is wider than widths W7, W8 of the first trench 5a. In the trench 5, the second trench 5b is formed by the third trench 5c and the fourth trench 5d. The width W3 of the fourth trench 5d is narrower than the width W2 of the third trench 5c.

The third trench 5c is disposed in the n-type drift layer 3 from a vicinity of the junction portion 11 of the n-type drift layer 3 and the p-type base layer 4 below the n-type emitter layer 7. The fourth trench 5d is disposed in the n-type drift layer 3 from a vicinity of the junction portion 11 of the n-type drift layer 3 and the p-type base layer 4 below the second p-type contact layer 8b, where the n-type emitter layer 7 is not formed. Further, the trench transition portion 5e of the transition from the first trench 5a to the third trench 5c, and from the first trench 5a to the fourth trench 5d is curved.

Among the side walls of the third trench 5c and the fourth trench 5d, the side wall on the side contacting the p-type base layer 4 of the floating portion E is flat and is not expanded. The p-type base layer 4 configuring the floating portion E is in a floating potential state and therefore, at the n-type drift layer 3 below the p-type base layer 4, holes accumulate, producing the IE effect. Concerning the width of the floating portion E, the width W10 of an area between the fourth trenches 5d is wider than a width W9 of an area between the third trenches 5c.

In the semiconductor device 600, the third trench 5c contacting the n-type emitter layer 7 is expanded, whereby the n-type drift layer 3 becomes narrow and the hole path becomes narrow. Therefore, in the semiconductor device 600, the drawing of the holes from the first p-type contact layer 8a is suppressed, the IE effect is produced, and the ON voltage is reduced.

The semiconductor device 600 enables the width W3 of the fourth trench 5d below the second p-type contact layer 8b to be made narrow compared to a conventional structure similar to the IGBT 800 depicted in FIG. 37, where the lower portion (corresponds to the third trench 5c and the fourth trench 5d) of the striped trenches are expanded in all regions. As a result, the semiconductor device 600 may lower gate capacitance and reduce switching loss.

The depth from the surface of the p-type base layer 4 where the n-type emitter layer 7 is formed and the p-type base layer 4 of the floating portion E may be set as a position of the second gate insulating film 6b, and the thicknesses of the third gate insulating film 6c and the second gate insulating film 6b may be set as the thickness of the first gate insulating film 6a. Further, here, although a plane pattern of the n-type emitter layer 7 is indicated to be a pattern corresponding to that depicted FIGS. 2A and 2B, the pattern may be that depicted in FIGS. 4A and 4B, or in FIGS. 6A and 6B.

A method of manufacturing the semiconductor device 100 according to a seventh embodiment of the present invention will be described. In the description herein, a process of forming the trench 5 and the gate electrode 9 will be described. FIGS. 14A, 14B, 15A, 15B, 16A, 16B, 17A, 17B, 18A, 18B, 19A, 19B, 20A, 20B, 21A, 21B, 22A, 22B, 23A, and 23B are diagrams of the method of manufacturing the semiconductor device 100 according to the seventh embodiment. FIGS. 14A to 23B depict sequential cross-sectional views of a main portion of the semiconductor device 100 during manufacture according to the method of manufacturing according to the seventh embodiment.

FIGS. 14A, 15A, 16A, 17A, 18A, 19A, 20A, 21A, 22A and 23A depict cross-sections corresponding to FIG. 3A in the first embodiment; and FIGS. 14B, 15B, 16B, 17B, 18B, 19B, 20B, 21B, 22B, and 23B depict cross-sections corresponding FIG. 3B in the first embodiment. In other words, FIGS. 14A, 15A, 16A, 17A, 18A, 19A, 20A, 21A, 22A and 23A depict a cross-section cut at a position corresponding to cutting line X1-X1 depicted in FIGS. 2A and 2B; and FIGS. 14B, 15B, 16B, 17B, 18B, 19B, 20B, 21B, 22B, and 23B depict a cross-section cut at a position corresponding to cutting line X2-X2 depicted in FIGS. 2A and 2B. In FIGS. 14A to 23B, the n-type emitter layer 7, the first p-type contact layer 8a, and the second p-type contact layer 8b are not depicted. In the description hereinafter, numbers indicated in parenthesis at the head of a sentence indicate a process sequence.

Figure 14A:
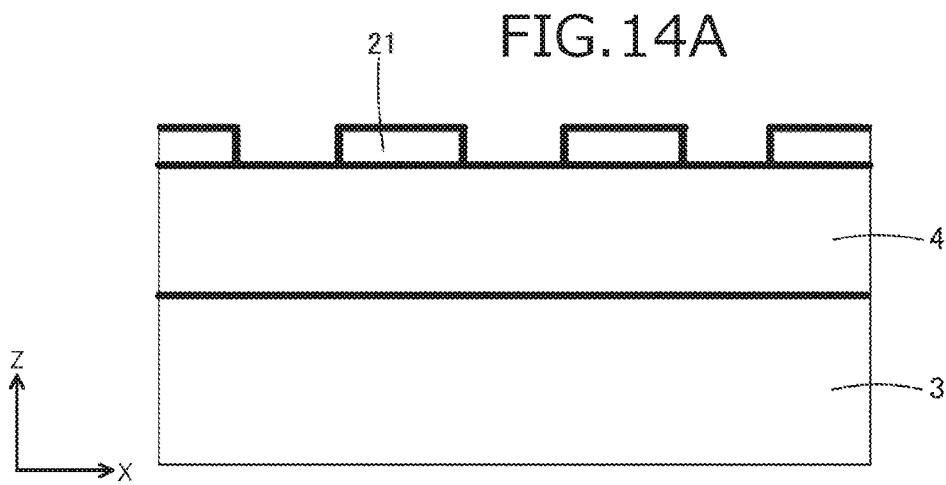
Figure 14B:
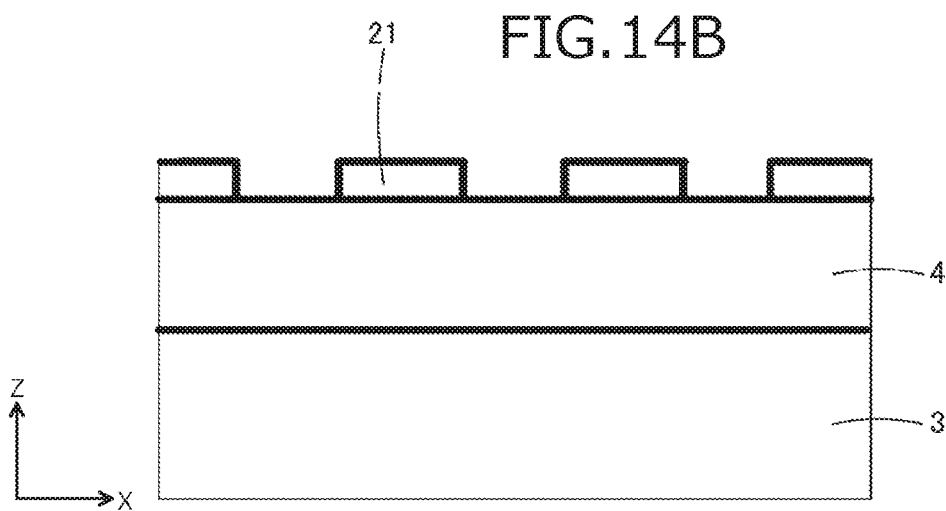

(1) As depicted in FIGS. 14A and 14B, an etching mask 21 is formed on the p-type base layer 4 (a first principal surface of the p-type base layer 4) of a semiconductor substrate on which the p-type base layer 4 is formed on the n-type drift layer 3. The etching mask 21, for example, is formed by a thermal oxide film.

Figure 15A:
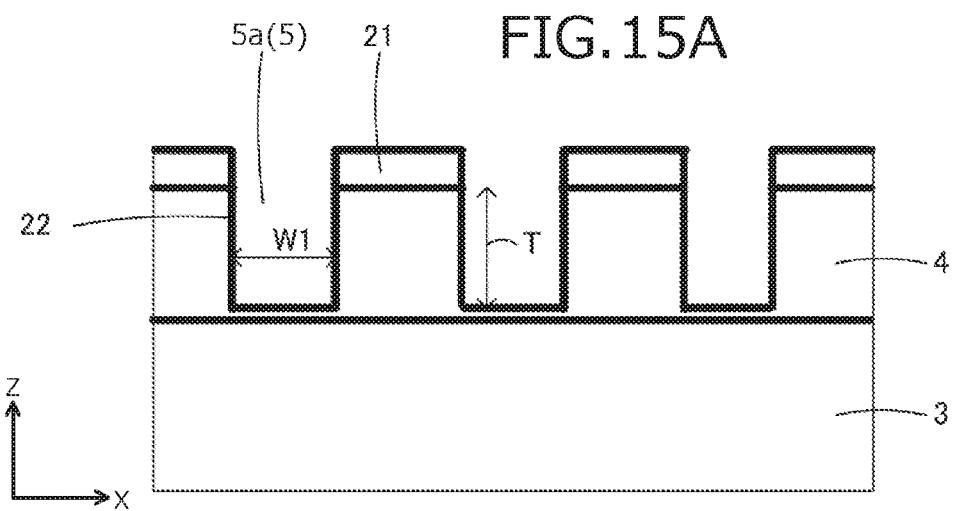
Figure 15B:
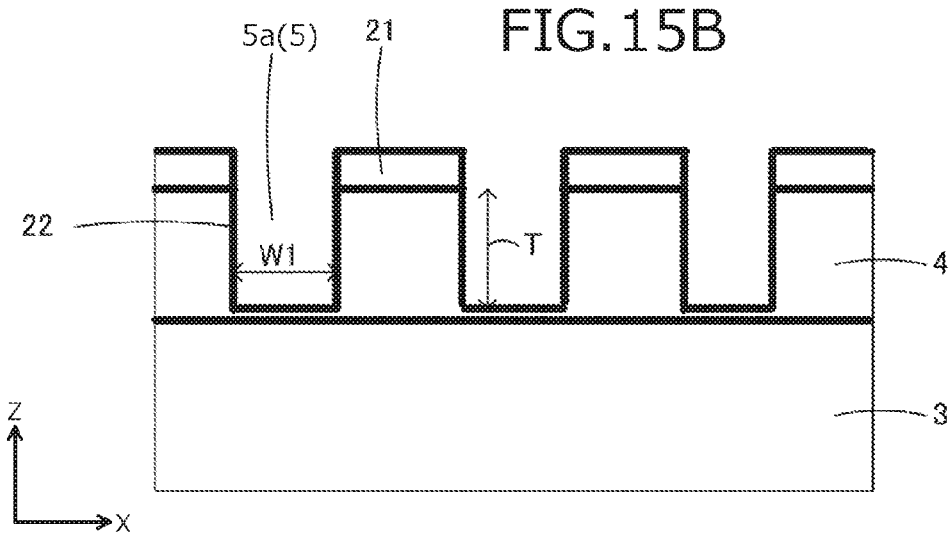

(2) As depicted in FIGS. 15A and 15B, the etching mask 21 is used to, for example, to perform anisotropic etching such as reactive ion etching (RIE) and form the first trench 5a of the width W1. A depth T of the first trench 5a is shallower than the thickness of the p-type base layer 4. Here, a damage layer (not depicted) is formed at an inner wall 22 of the first trench 5a consequent to the anisotropic etching for forming the first trench 5a.

Figure 16A:
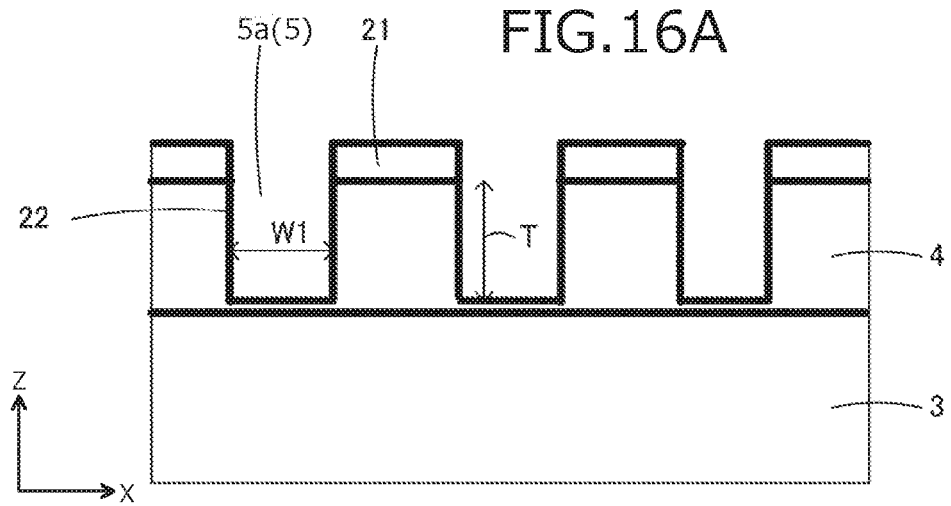
Figure 16B:
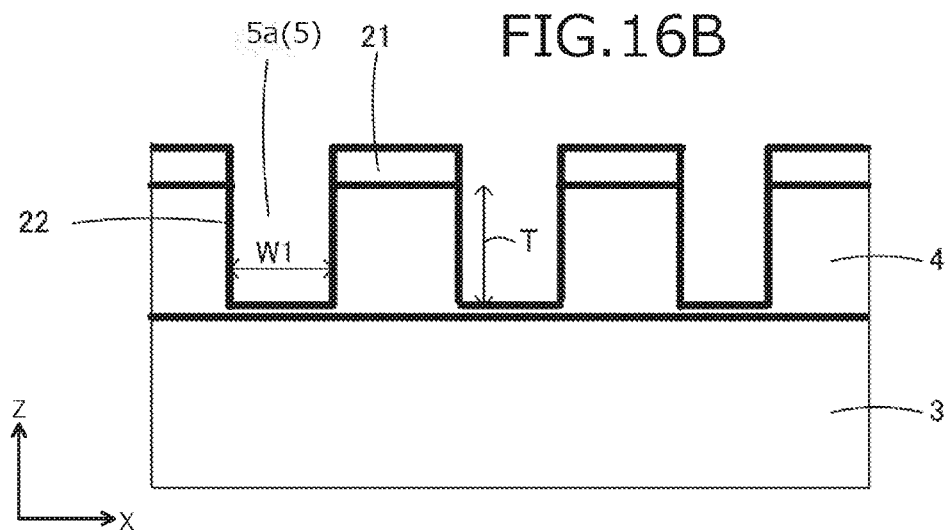

(3) As depicted in FIGS. 16A and 16B, the damage layer formed at the inner wall 22 of the first trench 5a is removed. The damage layer formed at the inner wall 22 of the first trench 5a, for example, may be removed by chemical dry etching (CDE).

(4) As depicted in FIGS. 17A and 17B, the first gate insulating film 6a is formed on the inner wall 22 of the trench 5 (the first trench 5a). The first gate insulating film 6a, for example, may be formed by chemical vapor deposition (CVD) such as SiN. The first gate insulating film 6a is also formed on the etching mask 21.

(5) As depicted in FIG. 18A, in a bottom 23 of the first trench 5a, the first gate insulating film 6a of an area where the wide-width third trench 5c is to be formed is removed. In the removal of the first gate insulating film 6a, for example, anisotropic etching may be performed using a non-depicted resist as a mask. Meanwhile, as depicted in FIG. 18B, in the bottom 23 of the first trench 5a, the first gate insulating film 6a is left in an area in which the narrow-width fourth trench 5d is to be formed. Thus, the remaining first gate insulating film 6a may be used as a mask for isotropic etching described hereinafter.

(6) As depicted in FIGS. 19A and 19B, in the bottom 23 of the first trench 5a, isotropic etching is performed with respect to the remaining portion of the first gate insulating film 6a, and the wide-width third trench 5c of a vessel-like shape of the width W2 that is wider than the width W1 of the first trench 5a is formed. The third trench 5c is a part of the trench 5 and is a part of the second trench 5b. The third trench 5c forms the lower portion of the second trench 5b.

(7) As depicted in FIG. 20A, an area where the third trench 5c is formed is covered by a resist 24. Further, as depicted in FIG. 20A, in the bottom 23 of the first trench 5a, the first gate insulating film 6a formed in an area where the fourth trench 5d is to be formed is removed.

Figure 21A:
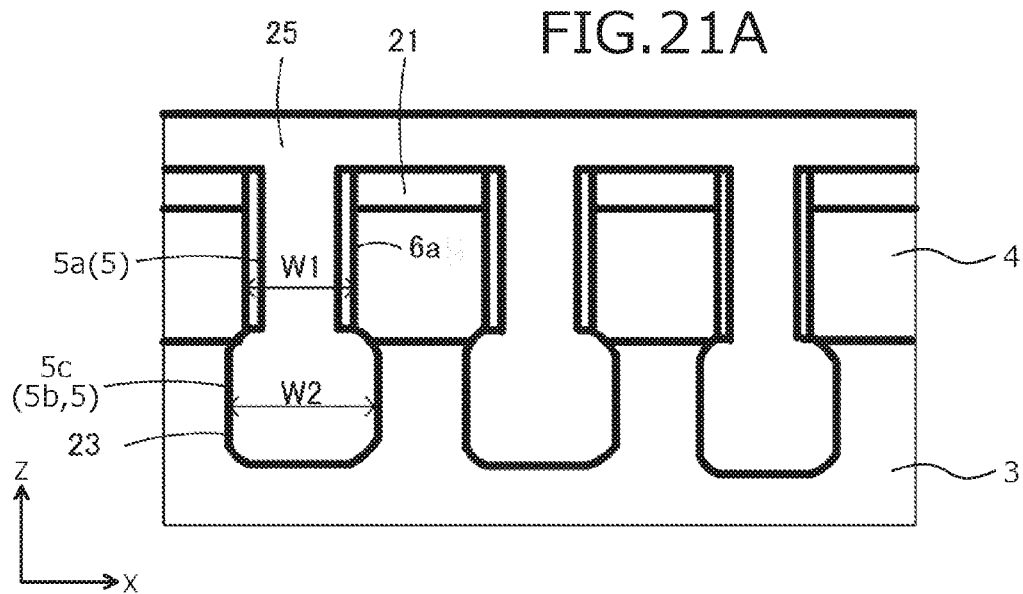
Figure 21B:
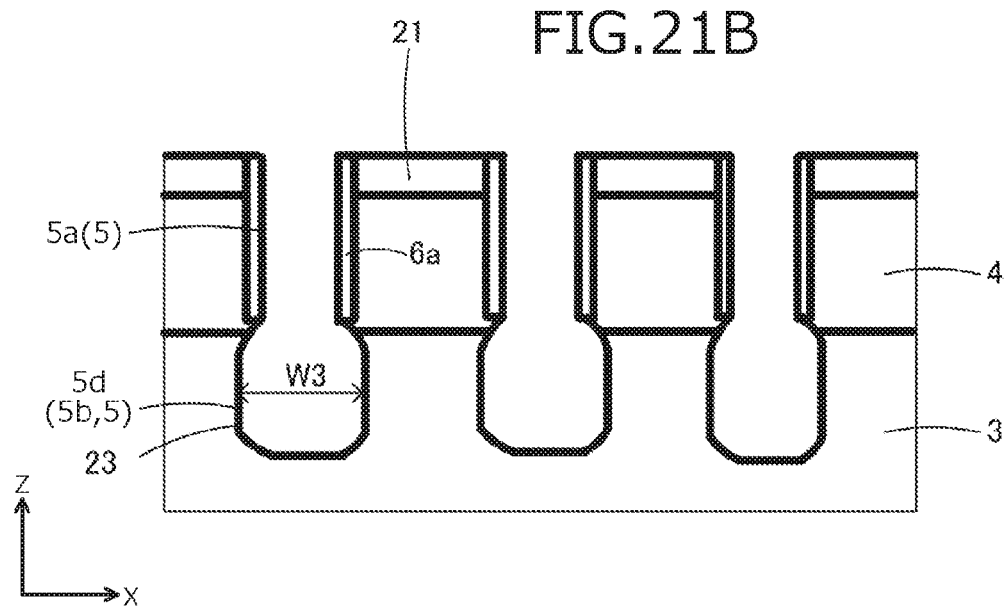

(8) As depicted in FIGS. 21A and 21B, isotropic etching is performed by etching conditions that differ from those when forming the third trench 5c, and the fourth trench 5d is formed. Etching conditions when the fourth trench 5d is formed, for example, may be a shorter etching time than that for forming the third trench 5c, delaying the etching, etc. to perform adjustments.

By the isotropic etching, the fourth trench 5d expanded into a vessel-like shape and of the width W3 that is narrower than the width W2 of the third trench 5c and wider than the width W1 of the first trench 5a is formed. The fourth trench 5d is a part of the trench 5 and is a part of the second trench 5b. The fourth trench 5d forms the lower portion of the second trench 5b.

(9) As depicted in FIGS. 22A and 22B, after the resist 24 is removed and the damage layers of the inner walls of the third trench 5c and the fourth trench 5d are removed, thermal oxidation is performed, forming the second gate insulating film 6b that is thicker than the first gate insulating film 6a, on the inner walls of the third trench 5c and the fourth trench 5d. Here, the third gate insulating film 6c for which the film thickness varies is formed at the trench transition portion 5e of the first trench 5a and the third trench 5c, and at the trench transition portion 5e of the first trench 5a and the fourth trench 5d. The junction portion 11 positioned at the interface of the p-type base layer 4 and the n-type drift layer 3 is positioned at the third gate insulating film 6c.

In the manufacturing of the semiconductor device 100, at process (5), the first gate insulating film 6a of the side wall may be removed; and at process (9), the first trench 5a, the third trench 5c, and the fourth trench 5d may be subject to thermal oxidation. In this case, the crystallinity of the side walls of the first trench 5a and the third trench 5c differ, and the crystallinity of the first trench 5a and the fourth trench 5d differ, whereby an oxide film becoming the first gate insulating film 6a of the first trench 5a is formed thinly, and an oxide film becoming the second gate insulating films 6b of the third trench 5c and the fourth trench 5d are formed thickly. Further, a thickness of an oxide film becoming the third gate insulating film 6c becomes thin on the first gate insulating film 6a and thick on the second gate insulating film 6b side.

Figure 23A:
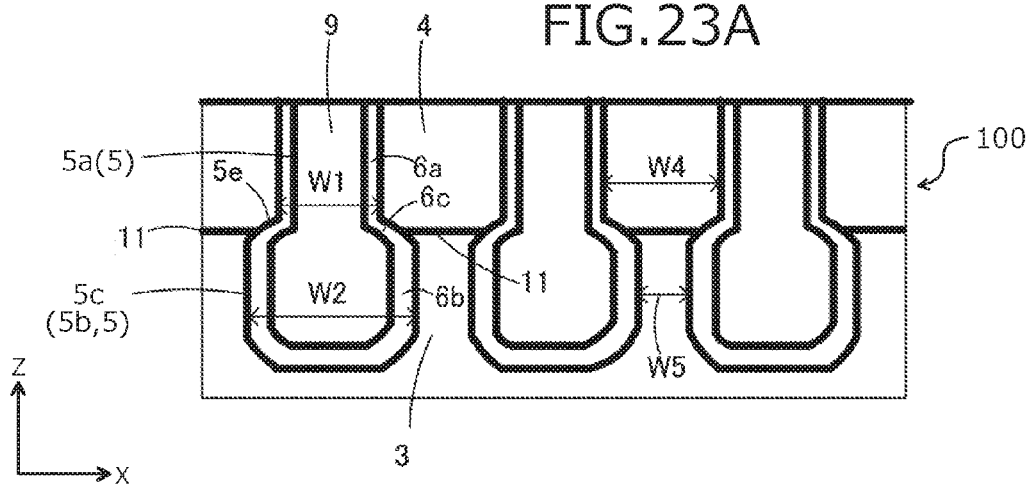
Figure 23B:
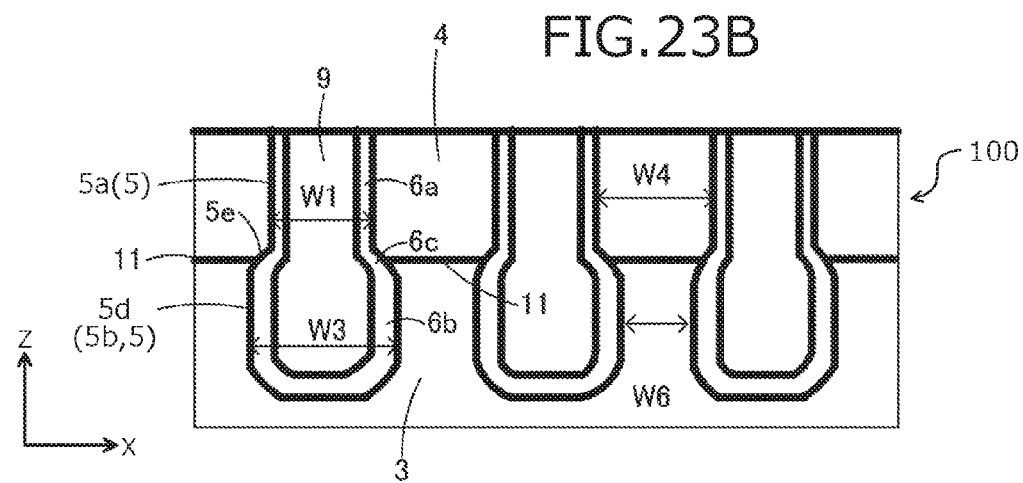

(10) A depicted in FIGS. 23A and 23B, the etching mask 21 is removed. Here, the first gate insulating film 6a formed on a side wall of the etching mask 21 is also removed. The first trench 5a, the third trench 5c, and the fourth trench 5d are filled with a polysilicon to form the gate electrode 9. Subsequently, the n-type emitter layer 7, the first p-type contact layer 8a, the second p-type contact layer 8b, and the emitter electrode (not depicted) are formed. A back surface of the semiconductor substrate is ground and polished, thinning the semiconductor substrate. Lastly, the n-type buffer layer 2, the p-type collector layer 1, and the collector electrode 10 are formed on a back surface of the n-type drift layer 3, completing the semiconductor device 100.

The p-type base layer 4 described at process (1) may be formed after process (10). In this case, the depth T of the first trench 5a formed at process (2) is made shallower than a depth of the p-type base layer 4 to be formed later.

A method of manufacturing the semiconductor device 600 according to an eighth embodiment of the present invention will be described. FIGS. 24A, 24B, 25A, 25B, 26A, 26B, 27A, 27B, 28A, 28B, 29A, 29B, 30A, 30B, 31A, 31B, 32A, 32B, 33A, 33B, 34A, 34B, 35A, 35B, 36A, and 36B are diagrams of the method of manufacturing the semiconductor device 600 according to the eighth embodiment. FIGS. 24A to FIG. 36B depict sequential cross-sectional views of a main portion of the semiconductor device 600 during manufacture according to the method of manufacturing according to the eighth embodiment. FIGS. 24A, 25A, 26A, 27A, 28A, 29A, 30A, 31A, 32A, 33A, 34A, 35A, and 36A depict cross-sections corresponding to FIG. 13A in the sixth embodiment; and FIGS. 24B, 25B, 26B, 27B, 28B, 29B, 30B, 31B, 32B, 33B, 34B, 35B, and 36B depict cross-sections corresponding to FIG. 13B. In the description hereinafter, numbers indicated in parenthesis at the head of a sentence indicate a process sequence.

Figure 24A:
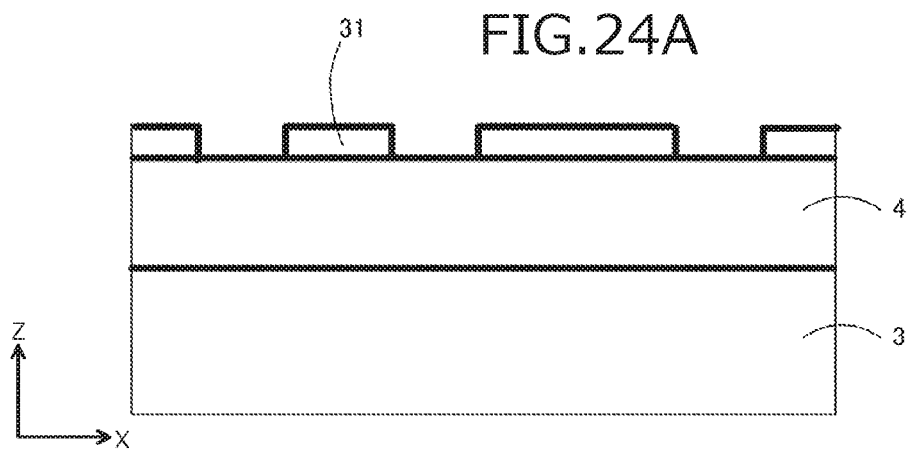
FIGS. 24A, 24B, 25A, 25B, 26A, 26B, 27A, 27B, 28A, 28B, 29A, 29B, 30A, 30B, 31A, 31B, 32A, 32B, 33A, 33B, 34A, 34B, 35A, 35B, 36A, and 36B are diagrams of a method of manufacturing the semiconductor device 600 according to an eighth embodiment.
Figure 24B:
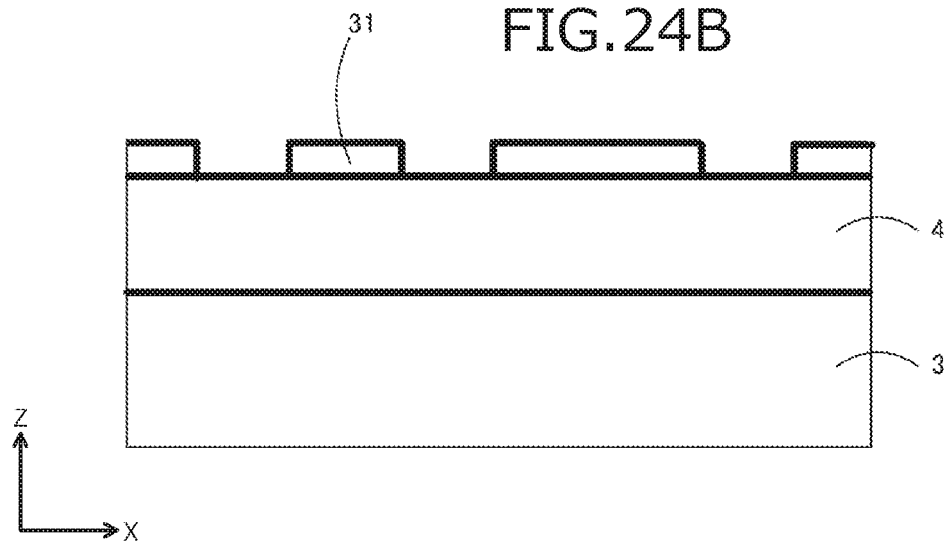

(1) As depicted in FIGS. 24A and 24B, an etching mask 31 is formed on the p-type base layer 4 (the first principal surface of the p-type base layer 4) of the semiconductor substrate on which the p-type base layer 4 is formed on the n-type drift layer 3. The etching mask 31, for example, is formed by a thermal oxide film.

Figure 25A:
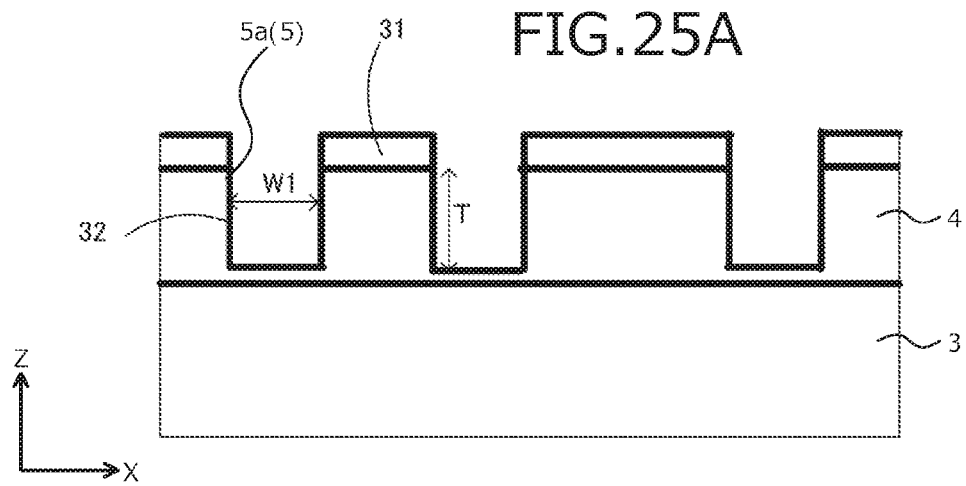
Figure 25B:
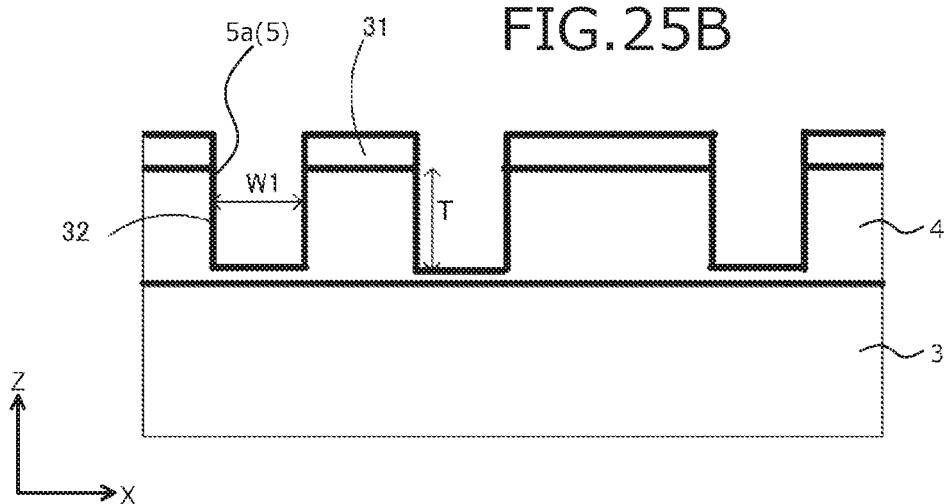

(2) As depicted in FIGS. 25A and 25B, the etching mask 31 is used, for example, to perform anisotropic etching such as reactive ion etching (RIE) and form the first trench 5a of the width W1. Here, a damage layer (not depicted) is formed at an inner wall 32 of the first trench 5a consequent to the anisotropic etching for forming the first trench 5a.

Figure 26A:
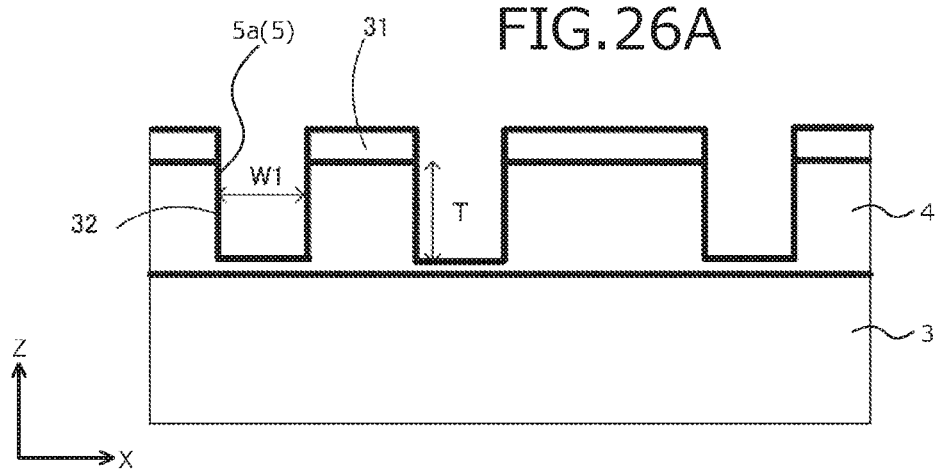
Figure 26B:
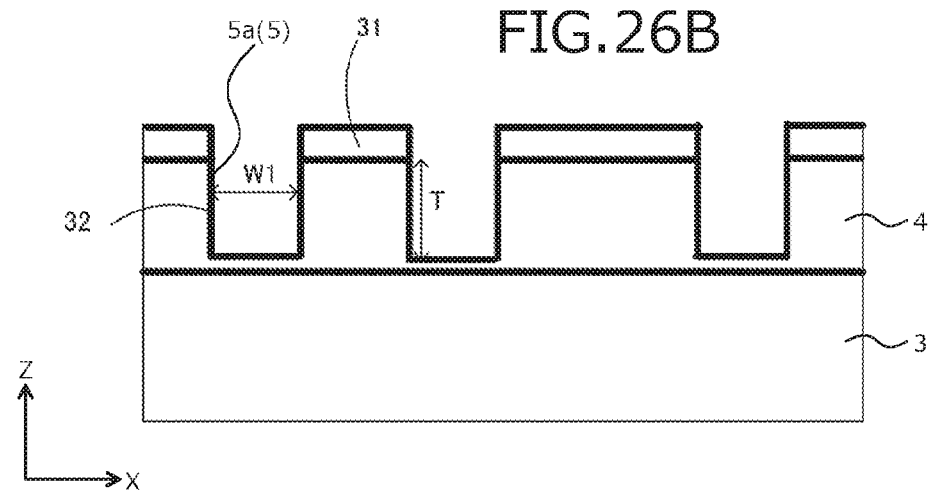

(3) As depicted in FIGS. 26A and 26B, the damage layer formed at the inner wall 32 of the first trench 5a is removed by, for example, chemical dry etching (CDE). The damage layer of the inner wall 32 of the first trench 5a, as described, is formed consequent to the anisotropic etching for forming the first trench 5a at process (2).

Figure 27A:
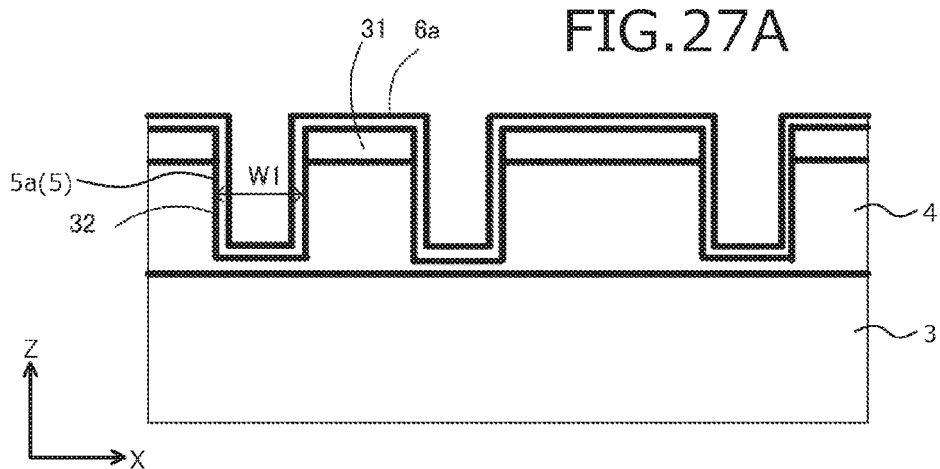
Figure 27B:
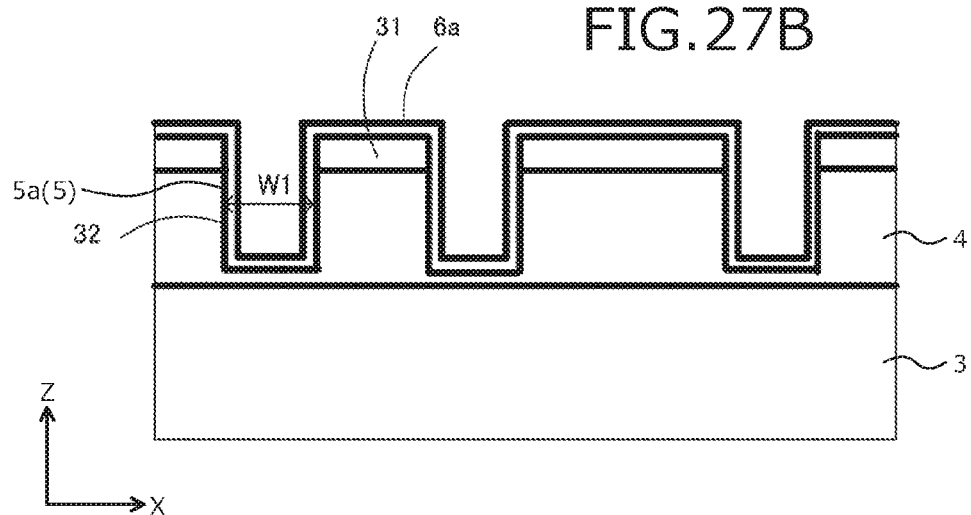

(4) As depicted in FIGS. 27A and 27B, the first gate insulating film 6a is formed on the inner wall 32 of the first trench 5a. The first gate insulating film 6a may be formed by, for example, CVD.

Figure 28A:
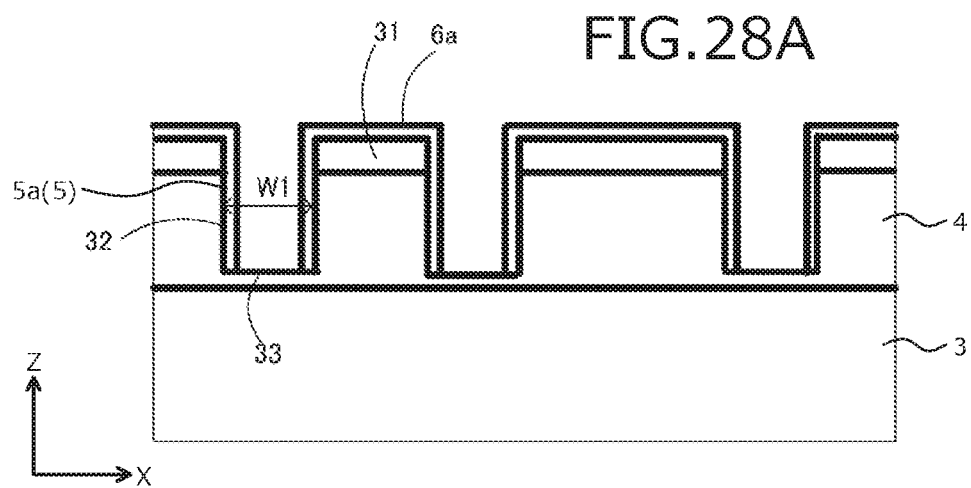
Figure 28B:
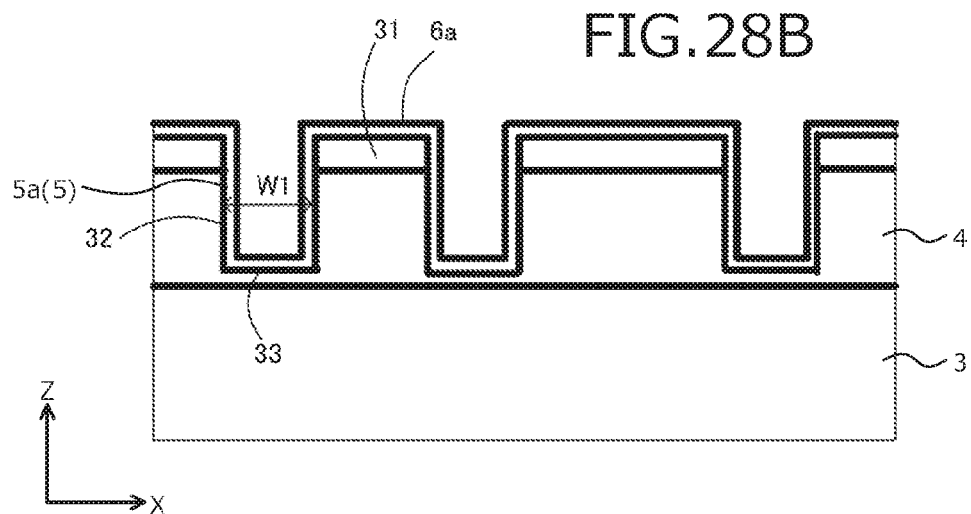

(5) As depicted in FIG. 28A, in a bottom 33 of the first trench 5a, the first gate insulating film 6a of an area where the wide-width third trench 5c is to be formed is removed. Meanwhile, as depicted in FIG. 28B, in the bottom 33 of the first trench 5a, the first gate insulating film 6a is left in an area where the thin-width fourth trench 5d is to be formed.

Figure 29A:
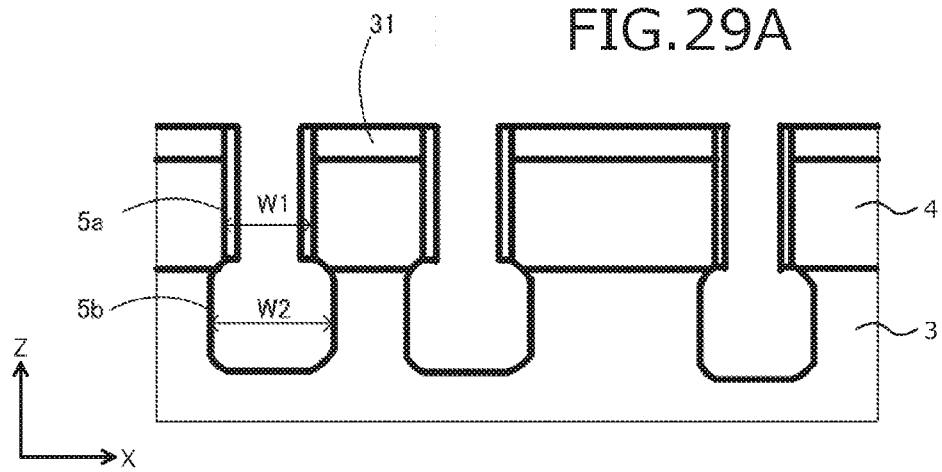
Figure 29B:
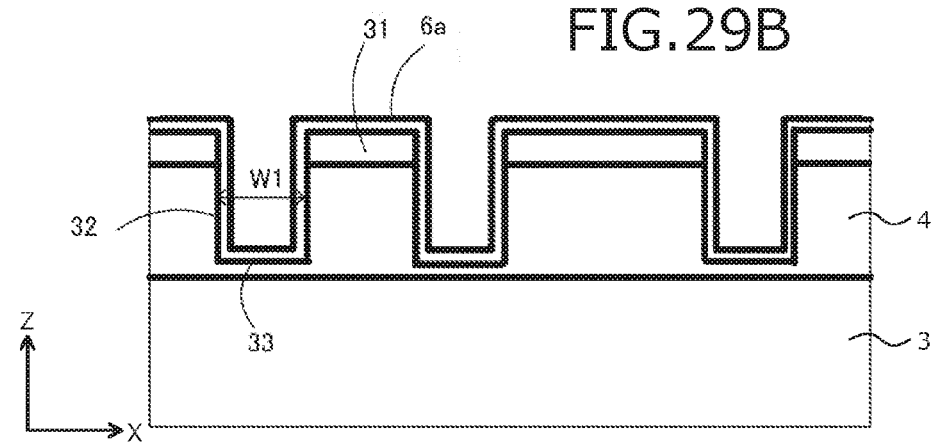

(6) As depicted in FIGS. 29A and 29B, in the bottom 33 of the first trench 5a, isotropic etching is performed with respect to the remaining portion of the first gate insulating film 6a, and the wide-width third trench 5c of a vessel-like shape of the width W2 that is wider than the width W1 of the first trench 5a is formed.

Figure 30A:
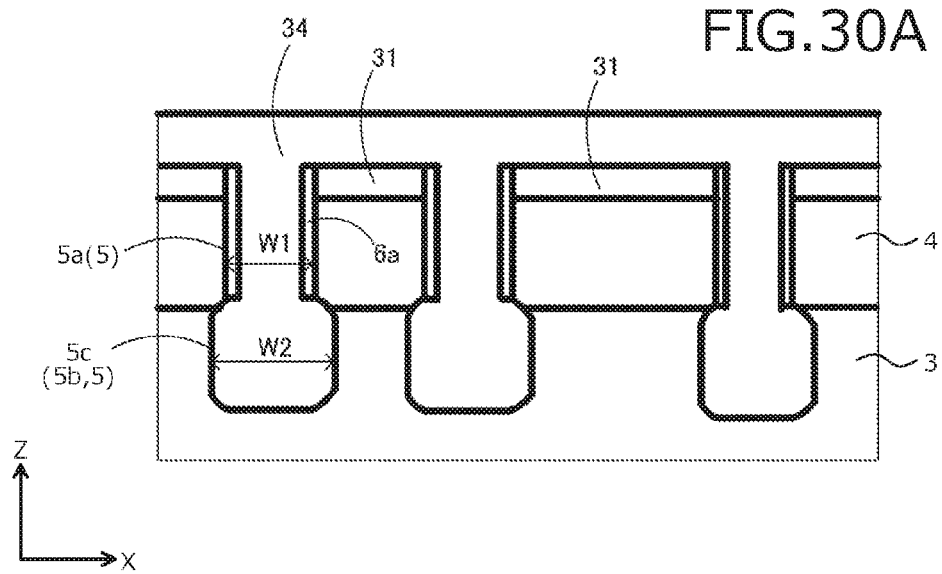
Figure 30B:
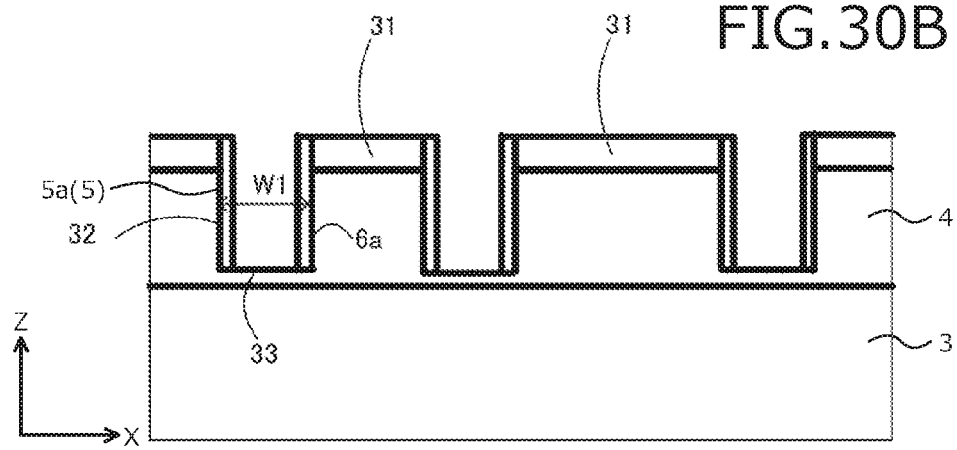

(7) As depicted in FIG. 30A, an area where the third trench 5c is formed is masked by a resist 34. As depicted in FIG. 30B, in the bottom 33 of the first trench 5a, the first gate insulating film 6a formed in an area where the fourth trench 5d is to be formed is removed.

Figure 31A:
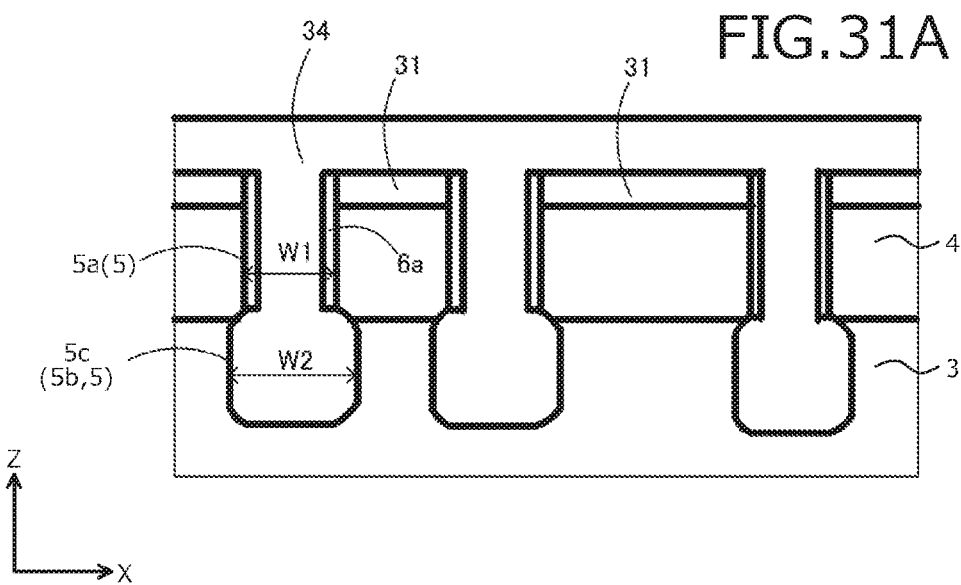
Figure 31B:
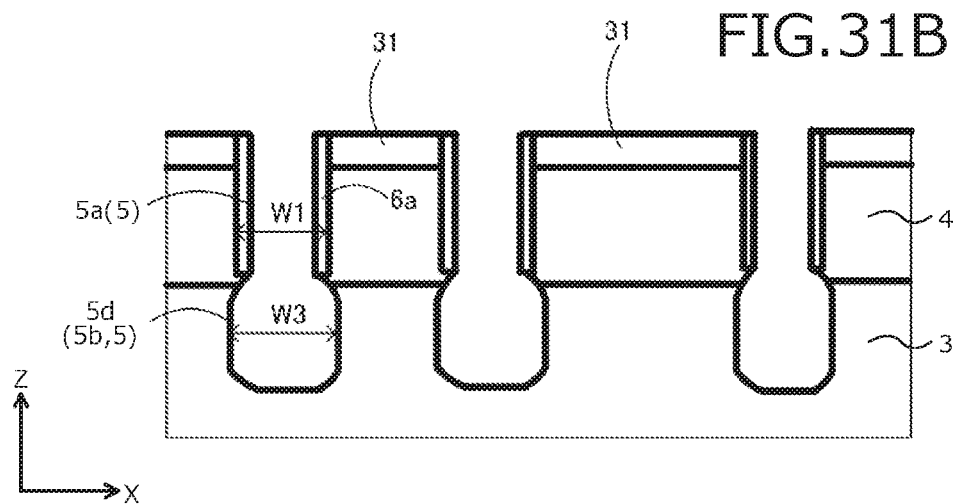

(8) As depicted in FIGS. 31A and 31B, isotropic etching is performed by etching conditions that differ from those when forming the third trench 5c, and the fourth trench 5d is formed. By the isotropic etching, the narrow-width fourth trench 5d expanded into a vessel-like shape and narrower than the width W2 of the third trench 5c is formed. The width W3 of the fourth trench 5d is made to be wider than the width W1 of the first trench 5a.

Figure 32A:
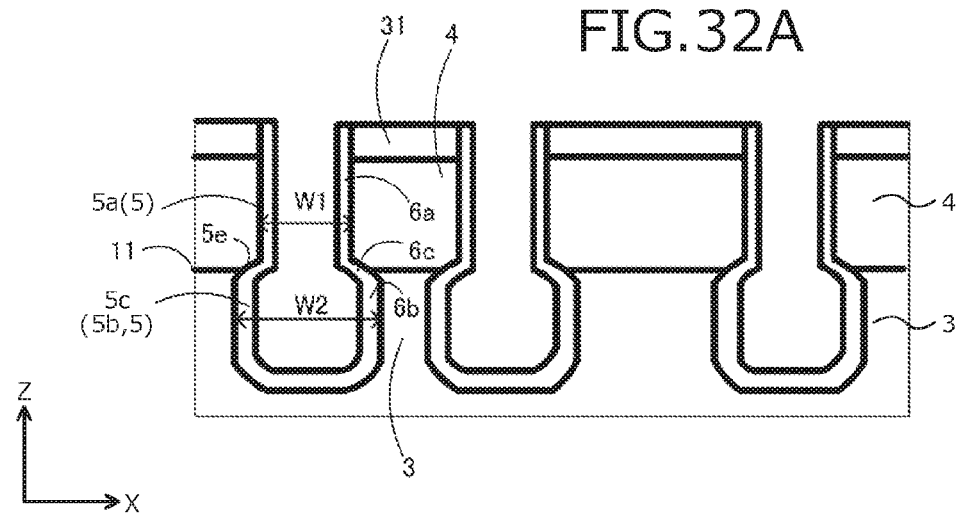
Figure 32B:
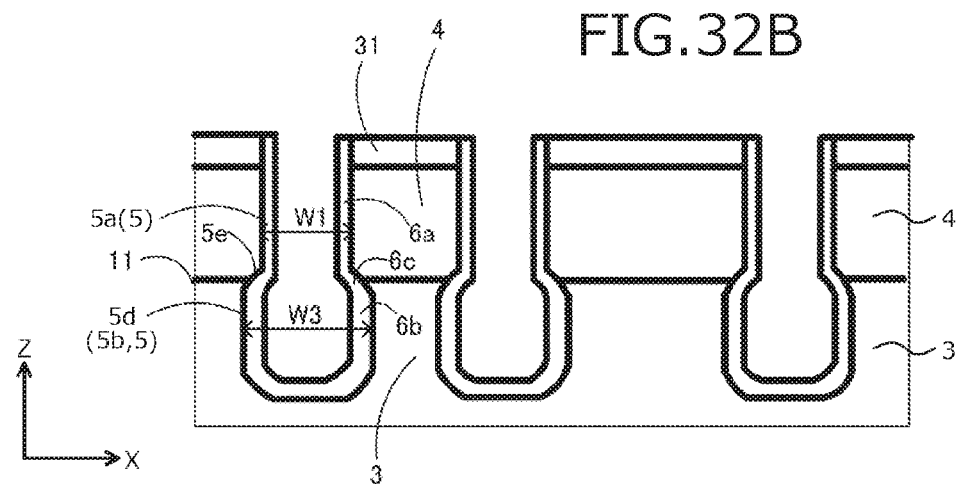

(9) As depicted in FIGS. 32A and 32B, the resist 34 is removed and thermal oxidation is performed, forming the second gate insulating film 6b that is thicker than the first gate insulating film 6a, on the respective inner walls of the third trench 5c and the fourth trench 5d. Here, the third gate insulating film 6c that varies in thickness at the trench transition portion 5e of the first trench 5a and the second trench 5b (formed by the third trench 5c and the fourth trench 5d) is formed. The junction portion 11 positioned at the interface of the p-type base layer 4 and the n-type drift layer 3 is positioned at the third gate insulating film 6c.

Figure 33A:
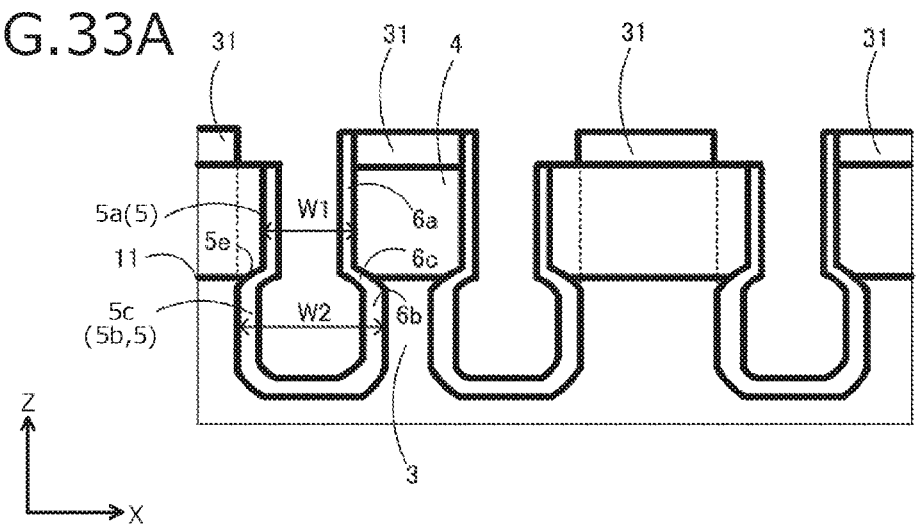
Figure 33B:
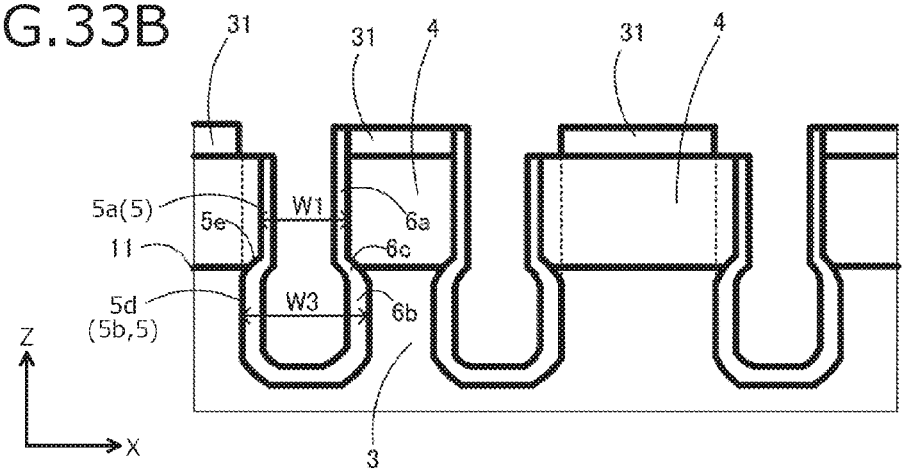

(10) As depicted in FIGS. 33A and 33B, in the etching mask 31 on the first trench 5a of a side contacting the floating portion E, a portion corresponding to the expanded portions of the third trench 5c and the fourth trench 5d is removed.

Figure 34A:
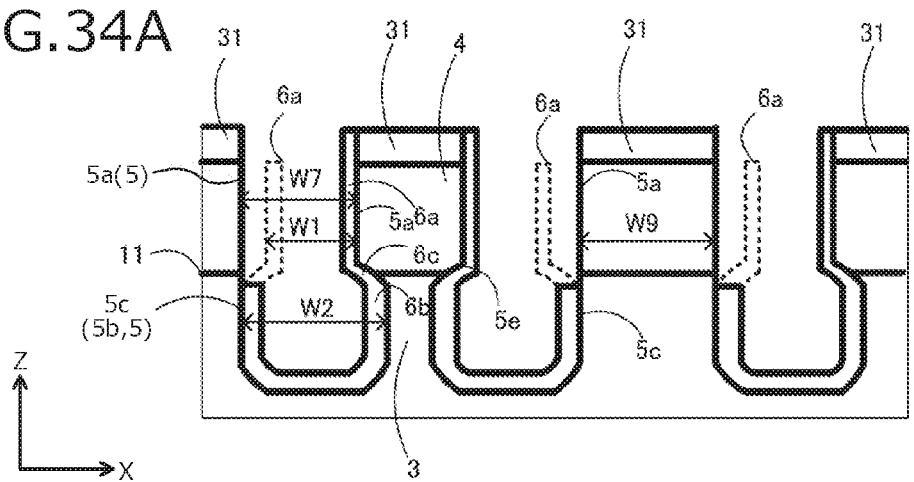
Figure 34B:
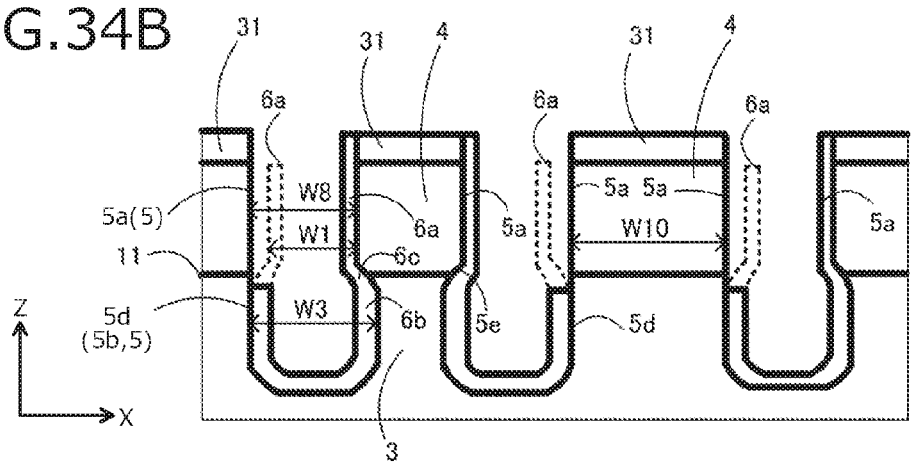

(11) As depicted in FIGS. 34A and 34B, anisotropic etching is performed, widening the width W1 of the first trench 5a to be consistent with the side walls of the third trench 5c and of the fourth trench 5d. In the widened first trench 5a, a width of a portion positioned above the third trench 5c is W7, and a width of a portion positioned above the fourth trench 5d is W8. A width of an area being the floating portion E is W9 at an upper area between the side walls of the third trenches 5c, and W10 at an upper area between the side walls of the fourth trenches 5d. The first gate insulating film 6a of a left side is simultaneously removed by the anisotropic etching.

Figure 35A:
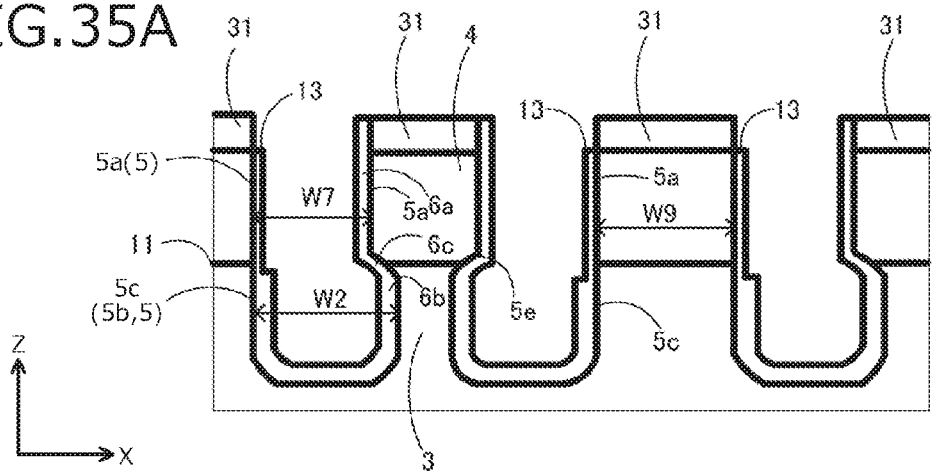
Figure 35B:
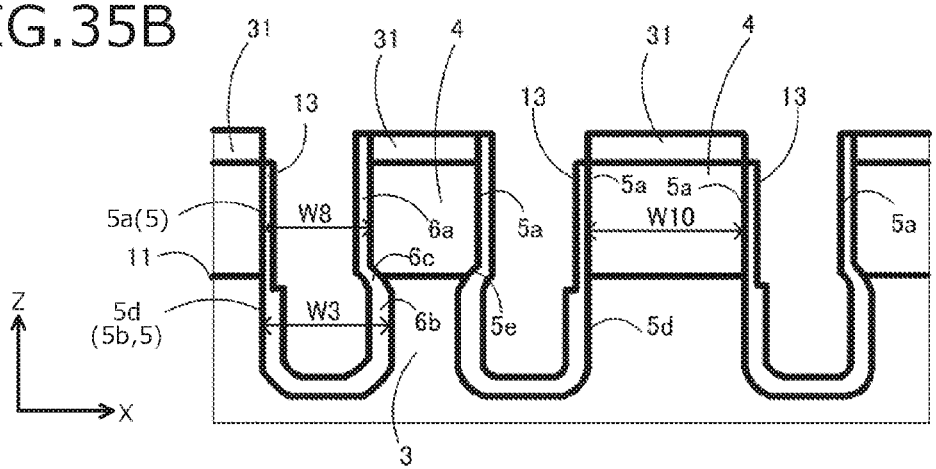

(12) As depicted in FIGS. 35A and 35B, an oxide film 13 is formed by thermal oxidation on the side wall where the first gate insulating film 6a of the first trench 5a is removed.

Figure 36A:
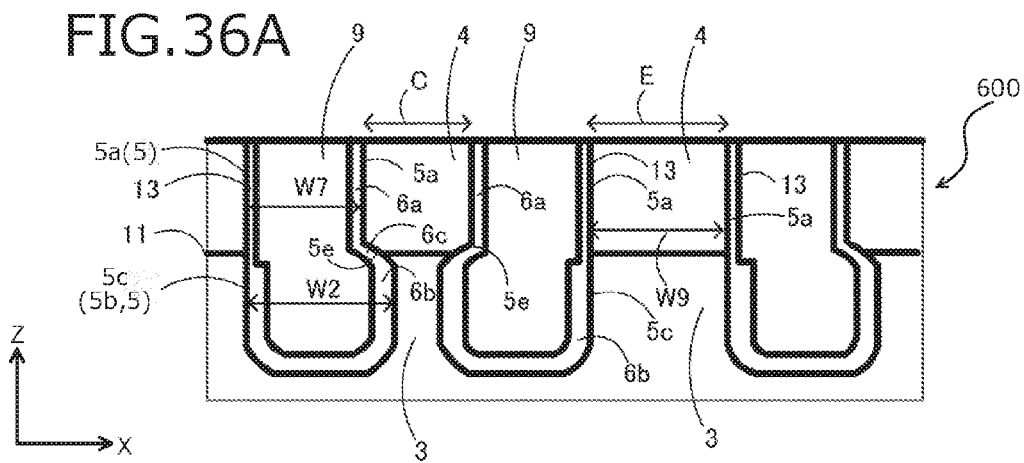
Figure 36B:
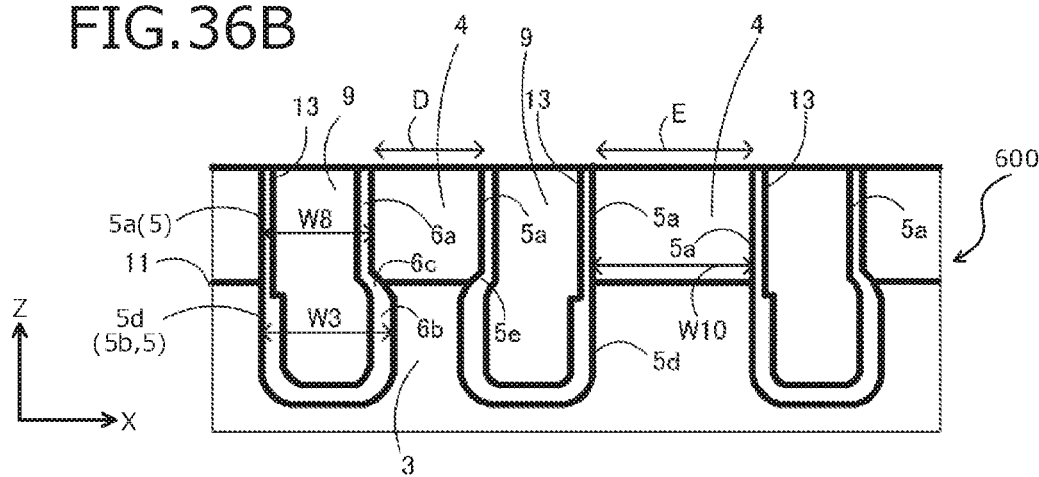

(13) As depicted in FIGS. 36A and 36B, the etching mask 31 is removed. Here, the oxide film 13 on the side wall of the etching mask 31 is also removed. Subsequently, the first trench 5a, the third trench 5c, and the fourth trench 5d are filled with a polysilicon, forming the gate electrode 9. The n-type emitter layer 7, the first p-type contact layer 8a, the second p-type contact layer 8b, the high-concentration p-type layer 12 configuring the floating portion E, and the emitter electrode (not depicted) are formed. Subsequently, the back surface of the semiconductor substrate is ground and polished, thinning the semiconductor substrate. Thereafter, the n-type buffer layer 2, the p-type collector layer 1, and the collector electrode 10 are formed on the back surface, completing the semiconductor device 600.

A semiconductor device 700 according to a ninth embodiment of the present invention will be described. In the ninth embodiment, portions identical to those described in the embodiments are given the same reference signs used in the embodiments and description thereof is omitted hereinafter. FIGS. 38A, 38B, 39A, and 39B are diagrams of a configuration of the semiconductor device 700 according to the ninth embodiment.

Figure 38A:
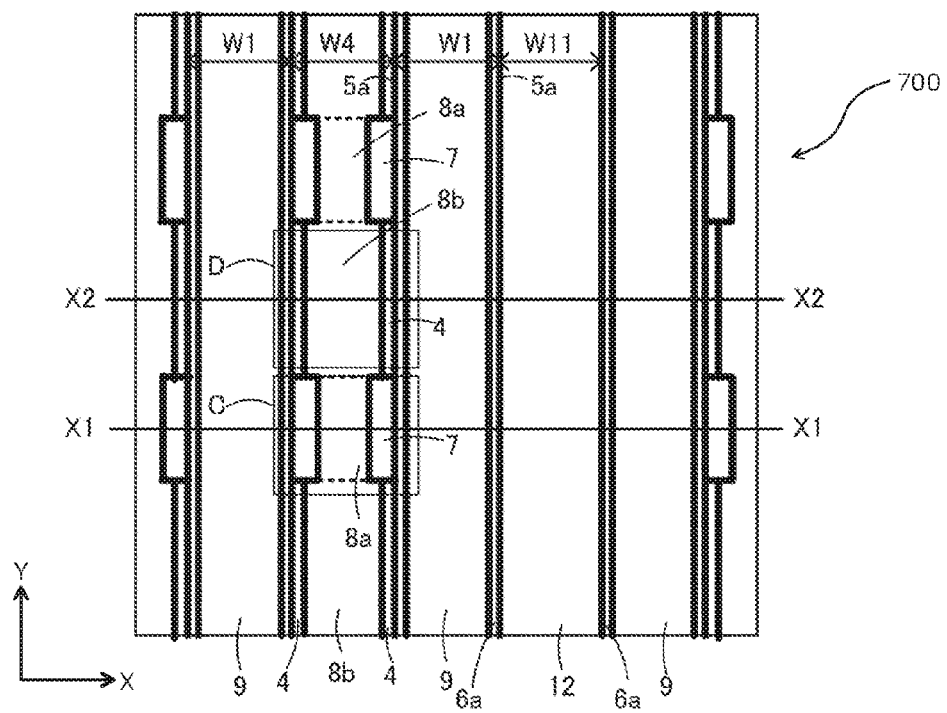
FIGS. 38A, 38B, 39A, and 39B are diagrams of a configuration of a semiconductor device 700 according to a ninth embodiment.
Figure 38B:
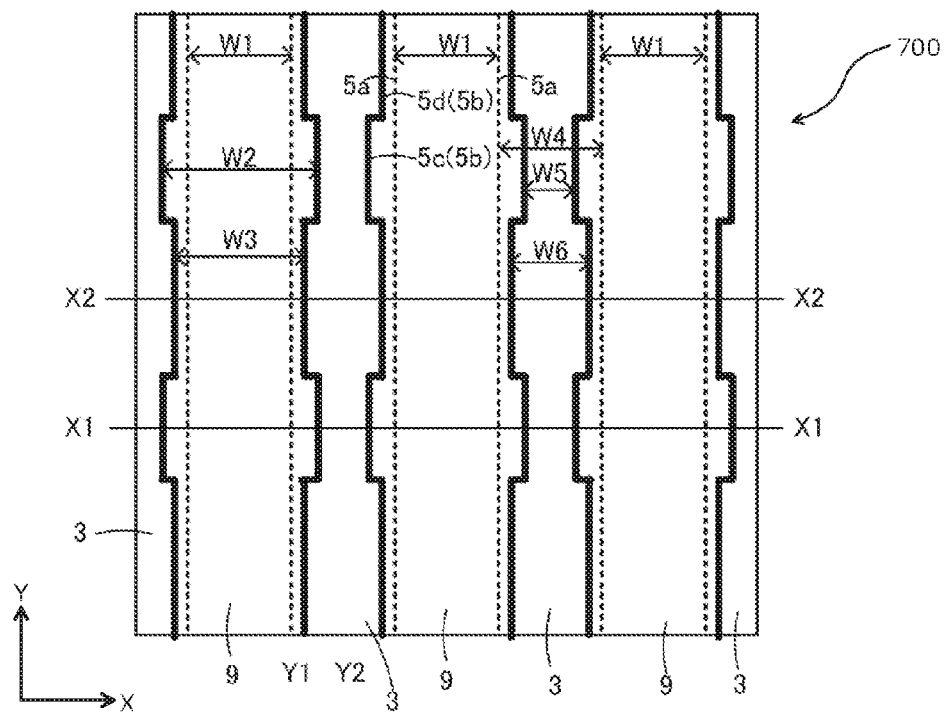
Figure 39A:
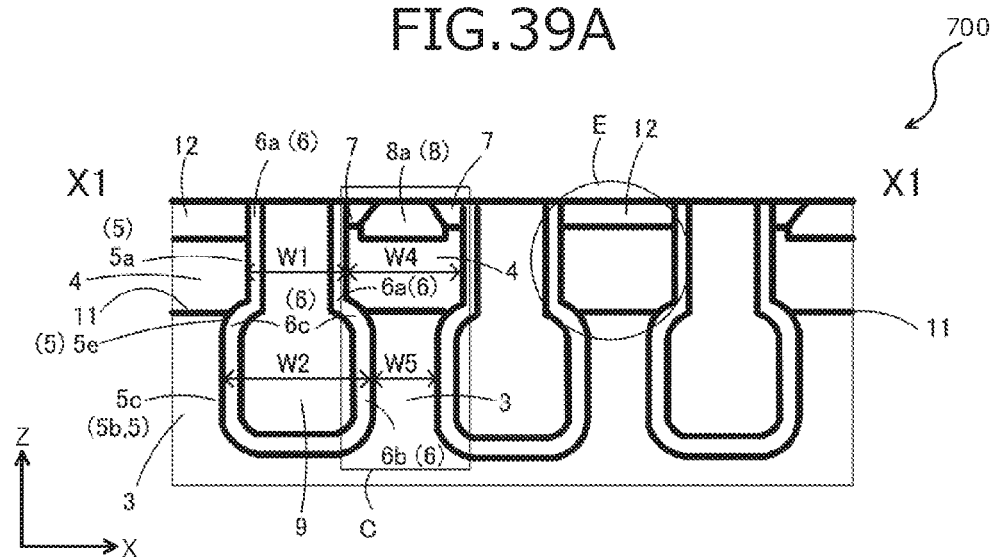
Figure 39B:
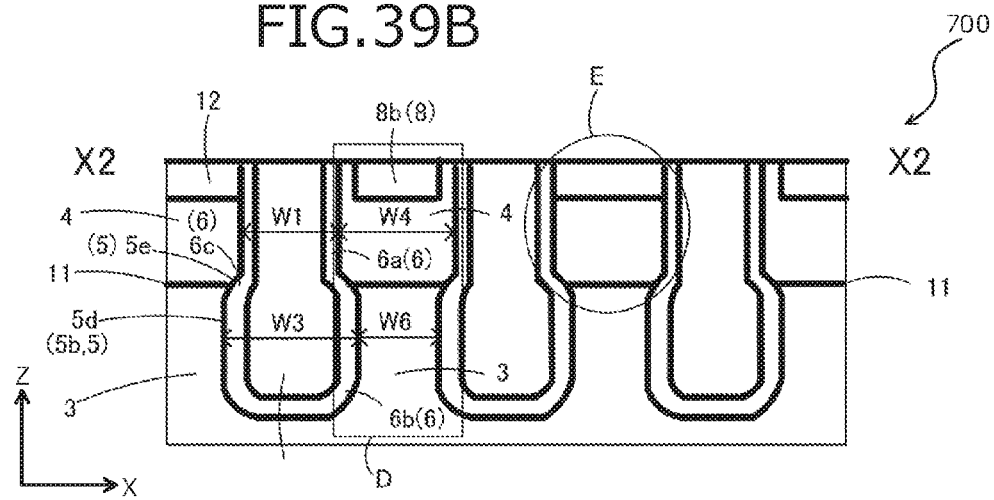

FIG. 38A depicts a layout of a main portion of the semiconductor device 700, and corresponds to FIG. 2A depicting the semiconductor device 100 of the first embodiment. FIG. 38B depicts a layout of a main portion of the semiconductor device 700, and corresponds to FIG. 2B depicting the semiconductor device 100 of the first embodiment. FIGS. 39A and 39B depict cross-sectional views of a main portion of the semiconductor device 700 according to the ninth embodiment, and correspond to FIGS. 3A to 3D depicting the semiconductor device 100 of the first embodiment. FIG. 39A is a cross-sectional view of the semiconductor device 700 cut along cutting line X1-X1 in FIGS. 38A and 38B. FIG. 39B is a cross-sectional view of the semiconductor device 700 cut along cutting line X2-X2 in FIGS. 38A and 38B.

As depicted in FIGS. 38A to 39B, the semiconductor device 700 according to the ninth embodiment differs from the semiconductor device 100 of the first embodiment in that the floating portion E is provided adjacent to the n-type emitter layer 7. Provision of the floating portion E enables the semiconductor device 700 to obtain the same effects as the semiconductor device 600 depicted in FIGS. 12A and 12B.

FIGS. 38A to 39B also correspond to the semiconductor device 600 depicted in FIGS. 12A, 12B, and 13A to 13D. In FIGS. 38A and 39A, reference sign C is the area where the n-type emitter layer 7 is formed. In FIGS. 38A and 39B, reference sign D is the area where along the Y direction, the n-type emitter layer 7 is segmented and the n-type emitter layer 7 is not formed. Reference sign E is an area where the floating portion is formed.

With the conventional technologies described, however, problems arise. For example, gate capacitance increases when the lower portion of the striped trench gate structure is expanded over the entire region of the n-type drift layer 53 as depicted by the IGBT 800 in FIG. 37. Further, consequent to the gate capacitance increasing, switching speed slows and switching loss increases. A further problem arises in that when the gate capacitance becomes large, a time constant determined by gate capacitance×gate resistance increases whereby, adjustment (control) of the rise time and fall time of the collector current by gate resistance becomes difficult.

The semiconductor device and the method of manufacturing the semiconductor device according to the present invention achieve an effect in that reduction of both ON voltage and switching loss is achieved concurrently with improved switching capability.

As described, the semiconductor device and the method of manufacturing the semiconductor device according to the present invention are useful for a semiconductor device and a method of manufacturing a semiconductor device such as an IGBT of a trench gate structure, and are particularly suitable for a semiconductor device and a method of manufacturing a semiconductor device such as a IGBT used as a switching device in the power electronics field.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor device comprising:
a first semiconductor layer of a first conductivity type;
a second semiconductor layer of a second conductivity type and disposed on a first principal surface of the first semiconductor layer;
a plurality of trenches each having a striped pattern along a first direction in plan view and penetrating the second semiconductor layer from a surface of the second semiconductor layer to reach inside the first semiconductor layer;
a gate insulating film disposed on an inner wall of the trenches;
a third semiconductor layer of the first conductivity type, including a plurality of semiconductor regions, each semiconductor region contacting a side wall of the trenches and being selectively disposed on a surface layer of the second semiconductor layer along a direction parallel to the first direction;
a fourth semiconductor layer of the second conductivity type, contacting the third semiconductor layer and disposed on the surface layer of the second semiconductor layer;
a main electrode electrically connected to the second semiconductor layer and the third semiconductor layer; and
a gate electrode disposed inside the trenches on the gate insulating film, wherein
each of the trenches comprises:
  a first trench portion disposed in the second semiconductor layer on a first principal surface side of the trenches;
  a second trench portion located farther in a first semiconductor layer side of the trenches than the first trench portion, connected to the first trench portion, and having a bottom disposed inside the first semiconductor layer,
the second trench portion comprises:
  a third trench portion forming a side wall of the second trench portion, below the third semiconductor layer; and
  a fourth trench portion forming the side wall of the second trench portion, below portions of the second semiconductor layer flanked by the third semiconductor layer along the first direction of the trenches,
the gate insulating film comprises:
  a first gate insulating film portion disposed on a side wall of the first trench portion along the side wall of the trenches; and
  a second gate insulating film portion disposed on the side wall of the second trench portion along the side wall of the trenches,
the second trench portion having a width greater than a width of the first trench portion, and
the third trench portion having a width greater than a width of the fourth trench portion.

2. The semiconductor device according to claim 1, wherein
the second gate insulating film portion having a film thickness greater than a film thickness of the first gate insulating film portion.

3. The semiconductor device according to claim 1, wherein
a pn junction of the first semiconductor layer and the second semiconductor layer is positioned in a transition region where a width of the trenches increases from the first trench portion toward the second trench portion.

4. The semiconductor device according to claim 1, wherein
a pn junction of the first semiconductor layer and the second semiconductor layer is positioned at the side wall of the first trench portion.

5. The semiconductor device according to claim 1, wherein
a film thickness of the second gate insulating film portion is equivalent to a film thickness of the first gate insulating film portion,
a pn junction of the first semiconductor layer and the second semiconductor layer is positioned at the second trench portion.

6. The semiconductor device according to claim 1, wherein
the fourth semiconductor layer includes
  a fifth semiconductor layer of the second conductivity type, disposed on a side of the trenches opposite another side of the trenches penetrating the third semiconductor layer; and
  a sixth semiconductor layer of the second conductivity type, connected to the fifth semiconductor layer, between portions of the third semiconductor layer, and disposed on the second semiconductor layer.

7. The semiconductor device according to claim 1, wherein
each semiconductor region of the third semiconductor layer and the fourth semiconductor layer are alternately disposed along first direction in the plan view.

8. The semiconductor device according to claim 1, wherein
each trench has a first side wall and a second side wall, and
one of the plurality of semiconductor regions of the third semiconductor layer contacting the first side wall and another one of the plurality of semiconductor regions of the third semiconductor layer contacting the second side wall are alternately disposed in the first direction each other in the plan view.

9. The semiconductor device according to claim 1, wherein
the trenches includes trenches in each of which
  the third semiconductor layer is not disposed, and
  the second semiconductor layer disposed therein is not connected to the main electrode, thereby forming a floating region.

10. The semiconductor device according to claim 1, wherein the second trench portion includes a plurality of third trench portions and a plurality of fourth trench portions, each third trench portion and each fourth trench portion being alternately and repeatedly arranged in the first direction.

11. The semiconductor device according to claim 1, wherein the third trench portion has a side wall that is expanded in a second direction perpendicular to the first direction and towards an inside the first semiconductor layer farther than a side wall of the fourth trench portion, a width from the side wall of the fourth trench to the side wall of the third trench portion in the second direction being greater than a width of the third semiconductor layer in a direction parallel to the second direction.

* * * * *